(12) United States Patent
Ebata et al.

(10) Patent No.: US 6,406,590 B1
(45) Date of Patent: Jun. 18, 2002

(54) METHOD AND APPARATUS FOR SURFACE TREATMENT USING PLASMA

(75) Inventors: Yusuke Ebata, Tenri; Tohru Okuda, Nara, both of (JP)

(73) Assignee: Sharp Kaubushiki Kaisha, Osaka (JP)

( * ) Notice: Subject to any disclaimer, the term of this patent is extended or adjusted under 35 U.S.C. 154(b) by 0 days.

(21) Appl. No.: 09/556,837

(22) Filed: Apr. 21, 2000

Related U.S. Application Data

(63) Continuation of application No. 09/149,334, filed on Sep. 8, 1998, now Pat. No. 6,058,751.

(30) Foreign Application Priority Data

Apr. 22, 1999 (JP) ............................................ 11-115557

(51) Int. Cl.⁷ .......................... H05H 1/00; C23C 16/00; H01L 21/00
(52) U.S. Cl. .................. 156/345; 118/723 E; 118/728; 438/710
(58) Field of Search ....................... 118/723 E, 727 ER, 118/728, 729, 723 I, 723 MW; 156/345; 438/710, 707, 706

(56) References Cited

U.S. PATENT DOCUMENTS

| 5,695,566 A | * | 12/1997 | Suzuki et al. ............ 118/723 E |
| 5,804,089 A | * | 9/1998 | Suzuki et al. .................. 216/71 |
| 5,879,741 A | * | 3/1999 | Itoh ........................... 427/172 |
| 5,964,947 A | * | 10/1999 | Zhao et al. .................. 118/715 |
| 5,972,435 A | * | 10/1999 | Takai et al. ................. 427/488 |
| 6,155,200 A | * | 12/2000 | Horiike et al. ........... 118/723 E |
| 6,155,202 A | * | 12/2000 | Nkano et al. ............ 118/723 E |

FOREIGN PATENT DOCUMENTS

| JP | 250969 A | 2/1990 |
| JP | 273978 A | 3/1990 |
| JP | 273979 A | 3/1990 |

* cited by examiner

*Primary Examiner*—Gregory Mills
*Assistant Examiner*—P. Hassanzadeh

(57) ABSTRACT

A method for treating a surface of a sample using plasma, including the steps of placing the sample in a predetermined atmosphere, locally supplying a reaction gas from a reaction gas supply portion to a vicinity of the sample, providing a wall surface opposed to the sample, providing a gas flow path having a low conductance from the reaction gas supply portion to the atmosphere, and locally forming a high-pressure reaction gas region having a pressure higher than the atmosphere in the gas flow path having a low conductance, and generating locally high-pressure plasma based on the reaction gas in the high-pressure reaction gas region; and subjecting the sample to surface treatment using an active seed in the high-pressure plasma.

21 Claims, 21 Drawing Sheets

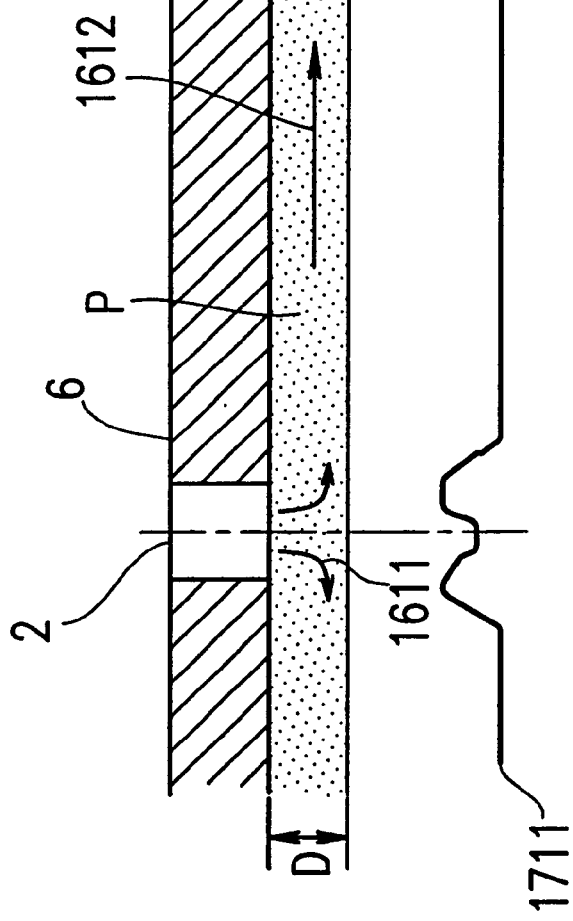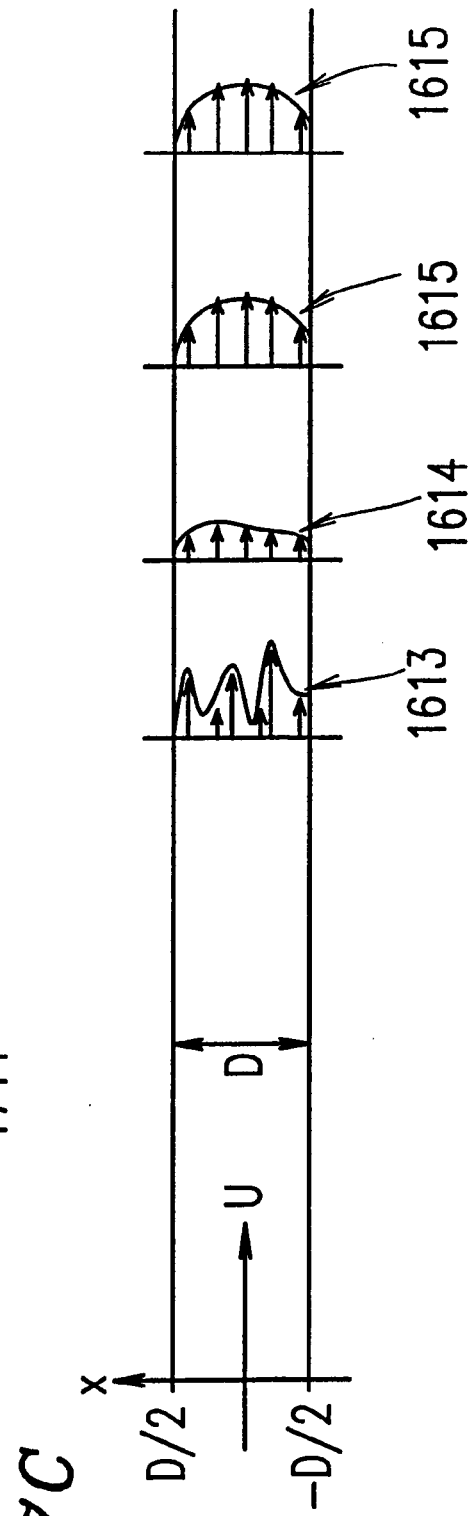
FIG. 7A
FIG. 7B
FIG. 7C

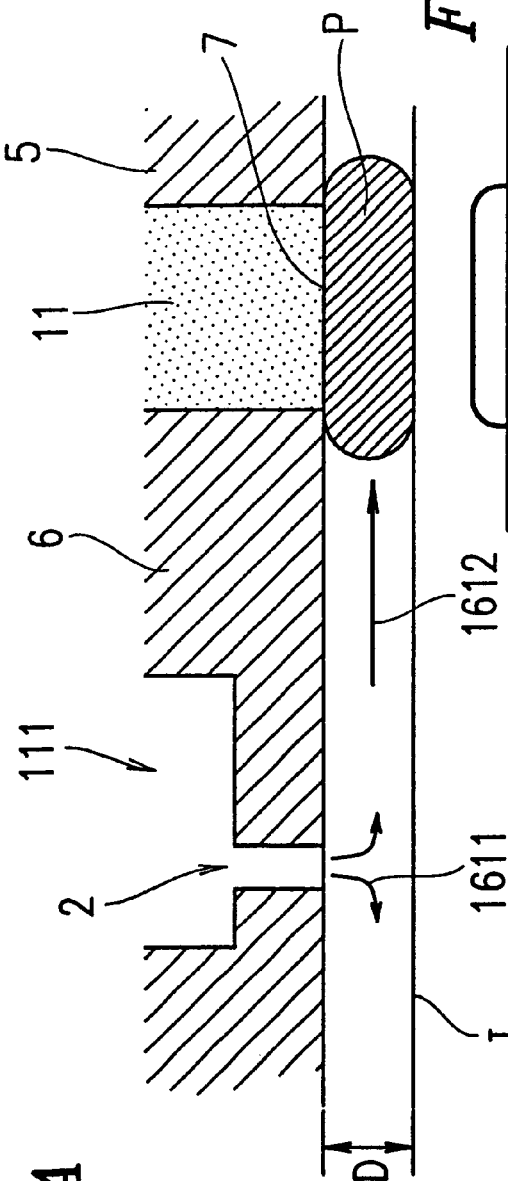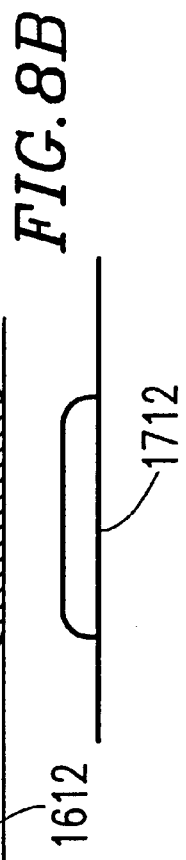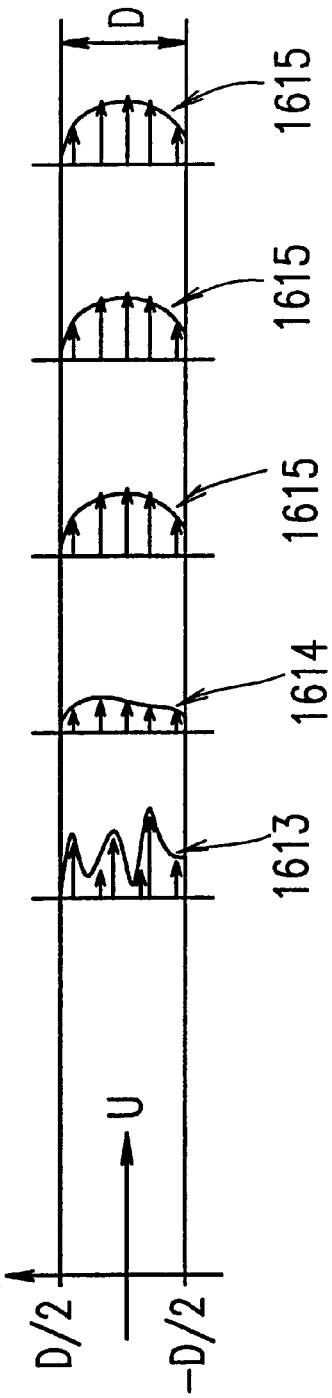

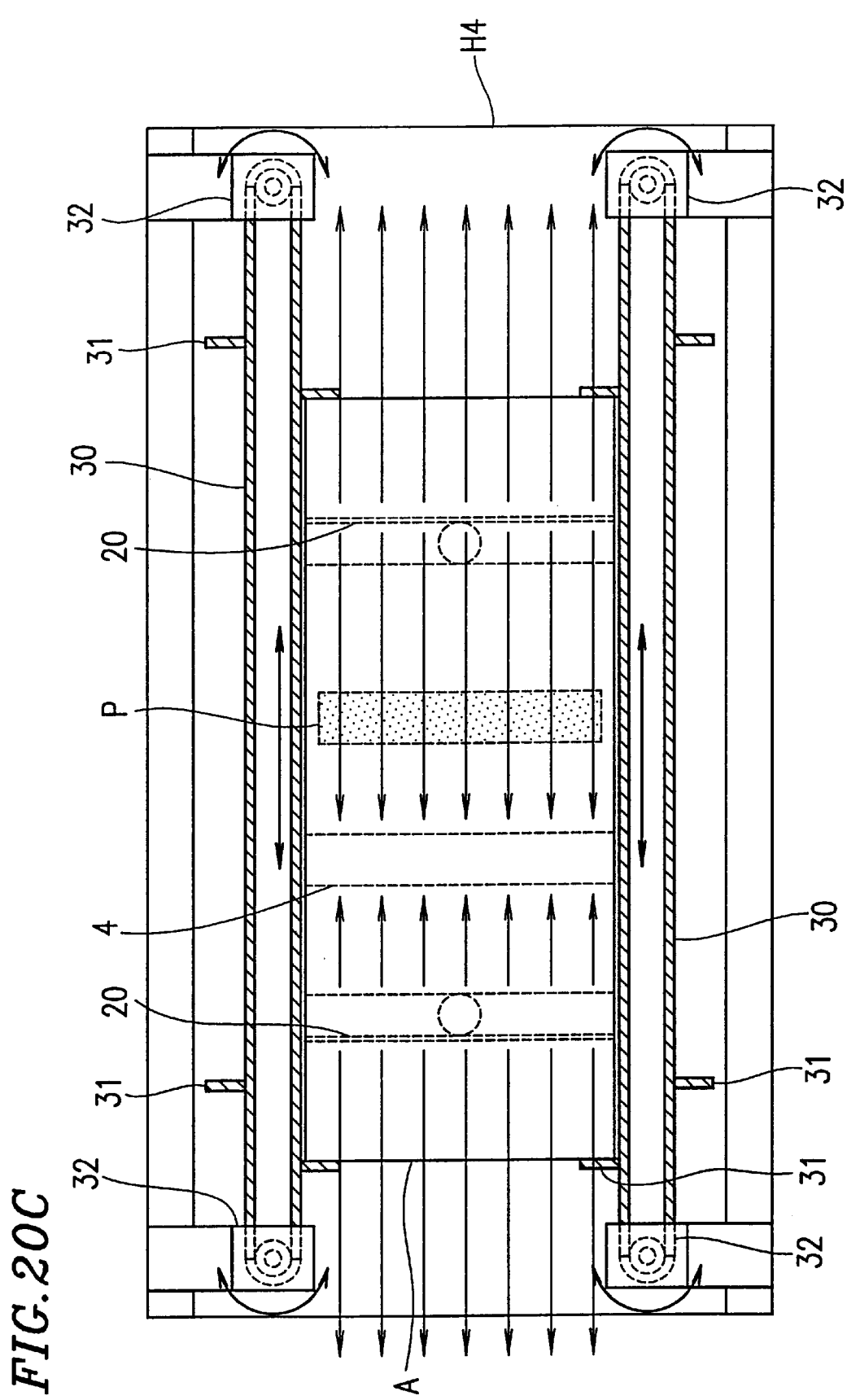

METHOD AND APPARATUS FOR SURFACE TREATMENT USING PLASMA

This application is a continuation of 09/149,334 filing date Sep. 8, 1998 now U.S. Pat. No. 6,058,751.

BACKGROUND OF THE INVENTION

1. Field of the Invention

The present invention relates to a surface treatment method and apparatus using plasma, and more particularly to a surface treatment method and apparatus for forming a film or modifying a surface in a multilayer structure device such as a semiconductor device and a liquid crystal device, and for forming a film of various functional materials or modifying a surface, using high-pressure plasma at high speed and under clean atmosphere. The word "surface treatment" generically includes the above-described film formation and surface modification.

2. Description of the Related Art

Plasma CVD is known as a method for forming a film in a multilayer structure of various devices such as a semiconductor device and a liquid crystal device or a film of various functional materials. The plasma CVD is now widely used in actual manufacturing processes. Plasma is also used in a known method for modifying a surface.

In the above-described plasma CVD or plasma surface modification method, reactive gas is selected in accordance with target film formation or surface modification. A high electric field is applied to the selected gas to be in a plasma state. Using active seeds generated in the plasma, a film is formed on a target surface or a target surface is modified. There are various techniques of generating plasma. In these techniques, plasma generation may be performed in various ranges of pressure and the like. The range of the applied preesure is not clearly defined. When plasma generation is performed under a low pressure, the density of the active seeds is low, so that the rate of film formation or surface modification is slow. For this reason, the throughput of an apparatus is small, contributing to an increase in cost of the product.

To solve the above-described problems and improve the rate of film formation or surface modification, the plasma generation may be performed under a high pressure which is as high as atmospheric pressure so that the density of the active seeds is increased. This method is, for example, disclosed by Japanese Laid-Open Publication Nos. 2-50969, 2-73978, or 2-73979. Hereinafter, a method disclosed by Japanese Laid-Open Publication No. 2-73978 will be described with reference to FIG. 24.

FIG. 24 is a diagram illustrating a configuration of an apparatus disclosed in the above-described publication. In FIG. 24, the apparatus includes a film formation chamber 241, a non-ground electrode 242, a ground electrode 243, a porous plate high resistor 244, a sample substrate 245, a gas inlet 246, a RF power supply 247, a heater 248, and a gas outlet 249.

According to the above-described publication, the electrodes 242 and 243 are arranged to face each other in the film formation chamber 241. The RF power supply 247 is connected to the non-ground electrode 242. The ground electrode 243 is connected to the ground. A high resistor (not shown), which has a size greater than or equal to the ground electrode 243, is optionally provided on the ground electrode 243. The sample substrate 245 is provided on the high resistor. The porous plate high resistor 244 is attached to the non-ground electrode 242. A gas mixture of a gas for film formation and He gas is supplied into the film formation chamber 241 from the inside of the non-ground electrode 242 through the holes of the porous plate high resistor 244. The supplied gas is simultaneously discharged from the gas outlet 249 so that the inside of the film formation chamber 241 keeps a pressure around the atmospheric pressure. In this case, when a distance between the porous plate high resistor 244 and the sample substrate 245 is defined as a intersubstrate gap 240$g$, the intersubstrate gap 240$g$ is between or equal to 0.1 mm and 10 mm.

In the above-described structure, radio frequency power is supplied to the non-ground electrode 242 from the RP power supply 247. Atmospheric pressure plasma 240$p$ is generated between the non-ground electrode 242 and the ground electrode 243 so that the film formation is performed on the sample substrate 245.

Experiments on the film formation were conducted using the conventional apparatus shown in FIG. 24. The conditions of the experiments are shown below in Table 1. The results of the experiments are shown below in Tables 2 and 3. Table 2 indicates a correlation between the intersubstrate gap 240$g$ and a film thickness distribution. Table 3 indicates a correlation between a value Q/S and a film formation rate in the central portion of the substrate 245, where the value Q/S is obtained by dividing an overall gas flow amount Q by the plasma volume S.

TABLE 1

| | ① | ② | ③ |
|---|---|---|---|
| Material gas | $SiH_4$ | $CH_4$ | $TiCl_4 + NH_3$ |
| Material gas/He | $SiH_4$/He | $CH_4$/He | $CH_4$/He $NH_3$/He |
| Temperature of substrate | 250° C. | 250° C. | 700° C. |
| Pressure | Atmospheric pressure | | |
| Rf power | 200 W | | |
| RF frequency | 13.56 MHz | | |
| Area of electrode | 10 × 10 cm$^2$ | | |
| High resistor, substrate-to-substrate distance | 3 mm | | |
| High resistor | Quartz glass | | |
| Substrate | Quartz glass (10 × 10 cm$^2$) | | |
| Thin film | α-Si | α-C | TiN |

TABLE 2

| Subtrate-to-substrate distance (mm) | ① α-Si | ② α-C | ③ TiN |
|---|---|---|---|
| 15 | ±25% | ±22% | ±27% |
| 10 | ±7% | ±9% | ±7% |
| 5 | ±5% | ±6% | ±6% |
| 3 | ±4% | ±4% | ±5% |
| 1 | ±6% | ±5% | ±7% |

TABLE 3

| Q/(sec) | ① α-Si | ② α-C | ③ TiN |
|---|---|---|---|
| $10^{-1}$ | Only dust | 0.08 | 0.10 |
| $10^0$ | 2.8 | 3.1 | 2.7 |
| $10^1$ | 28.7 | 24.3 | 21.8 |
| $10^2$ | 3.1 | 2.8 | 2.3 |
| $10^3$ | 0.08 | 0.11 | 0.14 |

As is seen from Tables 1 through 3, the apparatus disclosed in the above-described publication has the following features:

(1) the material gas for the film formation is diluted with a large amount of He gas for the purpose of obtaining a stable glow discharge;

(2) to form a uniform film over a large area, the high resistor 244 is provided on at least one of the electrodes 242 and 243. For this reason, a direct current does not flow, but only an alternating current flows. A current density per unit area is thus restricted, so that the plasma 240p can be uniformly spread:

(3) according to the experiment results shown in Table 2, the smaller the gap 240g between the sample substrate 245 and the high resistor 244, the smaller and more uniform the film thickness distribution of the obtained film. For this reason, the gap 240g between the sample substrate 245 and the high resistor 244 is set to 10 mm to 0.1 mm: and (4) according to the experiment results shown in Table 3, when the value Q/S which is obtained by dividing the overall gas flow amount Q by the discharge space volume S is $10^{-1}$ $sec^{-1}$, the supplied material gas is quickly decomposed. The film formation rate on the substrate 245 is decreased. On the other hand, when the value Q/S is large, the supply gas passes through the plasma 240p for a short time. The supplied gas substantially is not thus decomposed. The film formation rate is decreased and the material gas is not effectively used. For this reason, the mixture gas of the material gas for film formation and the He gas is supplied into the discharge space at a Q/S of 1 $sec^{-1}$ to $10^2$ $sec^{-1}$ so that the gas in the whole discharge space is replaced in $10^{-2}$ sec to 1 sec.

The above-described conventional technology has the following problems.

The film formation chamber 241 is filled with the mixture gas of the material gas for film formation and the He gas so that the pressure inside the chamber 241 is around the atmospheric pressure. The high-pressure plasma 240p is generated under such a high-pressure atmosphere. The plasma 240p decomposes the material gas for film formation. The decomposed material forms a film on the sample substrate 245. Because the film formation chamber 241 is filled with the mixture gas around the atmospheric pressure, reaction products generated in the plasma 240p are diffused outside the plasma 240p before being floated for a long time and condensed in the atmosphere. For this reason, the grain diameter of the reaction product as well as the number of such a reaction product is thus increased. The reaction product having the increased grain diameter is attached onto the surface of the sample substrate 245. The contamination of the grain-like product leads to a decrease in quality of a film. The reaction product is also attached onto the inner wall of the film formation chamber 241, thereby reducing the yield of this process.

Further, since the film formation chamber is filled with the high-pressure gas around atmospheric pressure, the number of moles of gas leaking outside the film formation chamber is large once the gas leak occurs. The safety of the apparatus is thus low.

Furthermore, it takes a long time to purge the reaction gas out of the film formation chamber 241 when removing the sample substrate 245. For this reason, although the film formation rate is fast, the throughput of the whole process of the apparatus is low.

The above-described three problems are ascribable to the whole reaction container being filled with high-pressure atmosphere.

Moreover, when the gap 240g between the electrodes is small, a reaction gas flow blowing off from the holes of the porous plate high resistor 244 collides with a surface of the sample substrate 245. A portion of the sample substrate 245 immediately under the blowoff hole has a film formation distribution different from the peripheral portion surrounding the hole. This leads to a reduction in uniformity of a film on the sample substrate 245.

When the gap 240g between the electrodes is small, the tilt of the non-ground electrode 242 with respect to the sample substrate 245 leads to a change in the flow amount distribution of the reaction gas, thereby reducing the uniformity of a film.

A power load is applied to the non-ground electrode 242. The sample substrate 245 is provided on the ground electrode 243. Since the high-pressure plasma 240p, which is difficult to be diffused, is generated between the non-ground electrode 242 and the ground electrode 243, the high-pressure plasma 240p is difficult to be generated on the entire sample substrate 245. It is thus difficult to obtain a uniform film on the entire sample substrate having a large area. Alternatively, the plasma 240p is generated on a portion of the sample substrate 245 which is smaller than the whole sample substrate 245. The non-ground electrode 242 and the sample substrate 245 are relatively moved in such a way as to form a film on the entire sample substrate 245. In this case, the movement of the electrode 242 or the substrate 245 changes the equivalent circuit of a power supply path, resulting in a film formation amount distribution. The uniformity of a film is thus reduced.

Among the above-described conventional problems, a description will be given of the first problem described above in connection with the formation and attachment of the reaction product having a large grain diameter, and the fourth problem described above in that the film formation amount distribution changes at a portion immediately under the blowoff holes of the porous plate high resistor 244.

Initially, a description will be given of principles of degradation of the quality of a film and a decrease in process yield due to filling the inside of the film formation chamber 241 with gas around atmospheric pressure.

The supplied material gas is decomposed in the atmospheric-pressure plasma 240p before reaching the sample substrate 245 to form a film on the sample substrate 245. In the plasma 240p, in addition to the decomposition and dissociation of the material gas, polymerization and condensation reactions occur at the same time. For this reason, there are a number of powder-like reaction products made of impurities contaminating the inside of the film formation chamber 241 and the material gas atoms. These reaction products also reach a surface of the substrate 245. The reaction products which are condensed in the plasma are immediately decomposed by the plasma 240p. The condensed reaction products do not contaminate the film formed on the substrate 245. The reaction product which is discharged outside the plasma 240p is not decomposed but are condensed with each other or impurities in the reaction container, increasing the grain diameter thereof. The number of the reaction products having such a large grain diameter is also increased. It is the reaction product having a large grain diameter that causes a problem. Such are action product is not easily decomposed when it is diffused into the plasma 240p. The reaction product having a large grain diameter can thus reach the sample substrate 245 and contaminates the film formed on the substrate 245, thereby reducing the quality of the film significantly. Further, the reaction product having a large grain diameter is attached onto the inner wall of the film formation chamber 241 and contaminates the inside of the film formation chamber 241, resulting in contamination of the film surface after the film formation. This decreases the process yield.

There is a problem in that in the above-descrIbed conventional technology, the outside of the plasma 240p has the same level of pressure as that of the inside of the plasma 240p so as to fill the inside of the film formation chamber 241 with gas having a high pressure around atmospheric pressure. A plausible way to solve the problem is to reduce the pressure of the atmosphere in the film formation chamber 241 so as to prevent an increase in the grain diameter and the number of grains of the reaction products outside the plasma 240p. In this case, however, the pressure of the plasma 240p also is decreased, so that the film formation rate is lowered and the throughput of the process is reduced.

As described above, in the conventional technology, the film formation under around atmospheric pressure leads to a decrease in film quality. Alternatively, the film formation under a lowered pressure does not allow the fast-rate film formation. These problems are ascribable to the conventional method in which the film formation is performed by generating the plasma 240p in the film formation chamber 241 which is filled with gas having the same level of pressure as that of the plasma.

Next, a description will be given of the film thickness distribution generated when film formation is performed immediately under a supply inlet of the porous plate high resistor 244 with reference to FIG. 25.

FIG. 25 is a diagram illustrating a film thickness distribution of a thin film 252 formed immediately under a reaction gas supply inlet 250. In FIG. 25, referencenumeral 250 indicates the gas supply inlet; 251 the floe of reaction gas colliding with the a sample substrate: 252 a thin film formed on the substrate; and 253 a protrusion portion of the thin film 252 formed immediately under the reaction gas supply inlet 250.

In the conventional structure shown in FIG. 24, the plasma 240p having a pressure around atmospheric pressure is generated between the non-ground electrode 242 and the sample substrate 245. A mixture gas of He gas and a material gas is blown into the plasma region from a number of the gas supply inlets 250. For example, a gap between the electrodes 242 and 243 is 0.1 mm to 10 mm in the above-described publication.

However, when the gap between the electrodes 242 and 243 is small, a flow 251 of the reaction gas blown off from the gas supply inlet 250 collides perpendicularly with a surface of the sample substrate immediately under the gas supply inlet 250. The portion immediately under the inlet 250 is efficiently supplied with the reaction gas, resulting in a larger film formation amount than the peripheral portion. Therefore, a protrusion portion (uneven film thickness distribution) 253 is formed as shown in FIG. 25.

In the conventional technology shown in FIG. 24, the gap between the electrode 242 and the sample substrate 245 cannot be lessened so as to prevent the This problem is ascribable to the structure in which the plasma 240p is generated between the electrode 242 and the sample substrate 245 and the reaction gas supply inlet 250 is provided at the plasma generating portion.

In the above description. the problems are explained when a film is formed on the sample substrate 245 using the conventional technique. Similar problems arise when the surface modification is performed.

SUMMARY OF THE INVENTION

According to one aspect of the present invention, a method for treating a surface of a sample using plasma includes the steps of placing the sample in a predetermined atmosphere; locally supplying a reaction gas from a reaction gas supply portion to a vicinity of the sample; providing a wall surface opposed to the sample; providing a gas flow path having a low conductance from the reaction gas supply portion to the atmosphere; and locally forming a high-pressure reaction gas region having a pressure higher than the atmosphere in the gas flow path having a low conductance; and generating locally high-pressure plasma based on the reaction gas in the high-pressure reaction gas region: and subjecting the sample to surface treatment using an active seed in the high-pressure plasma.

In one embodiment of this invention, the atmosphere is provided in a reaction container comprising an electrode having a shape corresponding to a surface shape of the sample. The sample is separately provided in the atmosphere, or on a sample stage having a shape corresponding to the surface shape of the sample and provided in the reaction container. The reaction gas supply portion is provided at least one of the electrode and the sample stage.

According to another aspect of the present invention, an apparatus for treating a surface of a sample using plasma, wherein the sample is provided in a predetermined atmosphere: a reaction gas from a reaction gas supply portion is supplied to a vicinity of the sample locally: a wall surface is provided opposed to the sample; a gas flow path having a low conductance is provided from the reaction gas supply portion to the atmosphere: and a high-pressure reaction gas region havi ng a pressure higher than the atmosphere is locally formed in the gas flow path having a low conductance; and high-pressure plasma based on the reaction gas is generated in the high-pressure reaction gas region locally; and the sample is subjected to surface treatment using an active seed in the high-pressure plasma.

In one embodiment of this invention, the apparatus further includes a section for providing px/p0>1 where the px/p0 is a ratio of a pressure px of a region in which the high-pressure plasma is generated locally in the high-pressure reaction gas region to a pressure p0 of the atmosphere.

In one embodiment of this invention, the apparatus further includes a section for providing locally the high-pressure plasma at a position away from the reaction gas supply portion in the high-pressure reaction gas region.

In one embodiment of this invention, the apparatus further includes a sample stage, wherein the sample is placed on the sample stage; and the sample stage has a shape corresponding to the sample.

In one embodiment of this invention, the apparatus further includes a power supply and an electrode, wherein the wall surface is provided by using the surface of the electrode; power is applied to the electrode to generate the high-pressure plasma.

In one embodiment of this invention, the electrode has a shape corresponding to the shape of the sample.

In one embodiment of this invention, the electrode further has a reaction gas supply inlet for supplying the reaction gas to the gas flow path having a low conductance.

In one embodiment of this invention, the electrode is opposed to the sample; there is a micro gap between the electrode and the sample: a surface opposed to the sample of the electrode functions as the wall surface.

In one embodiment of this invention, at least one of the electrode and the sample stage is movable. Due to a difference in pressure between a pressure of the atmosphere in the reaction container and a pressure of the reaction gas supplied from the reaction gas supply portion, one of the electrode and the sample stage is floated with respect to the other; there is a micro gap between the electrode and the sample; and a surface opposed to the sample of the electrode functions as the wall surface.

In one embodiment of this invention, at least one of the electrode and the sample stage is movable. An arrangement for generating a magnetic force having a predetermined magnetic intensity is provided on at least one of the electrode and the sample stage. Due to the magnetic force generated by the arrangement, one of the electrode and the sample stage is floated with respect to the other; there is a micro gap between the electrode and the sample; and a surface opposed to the sample of the electrode functions as the wall surface.

In one embodiment of this invention, at least one of the electrode and the sample stage is movable. An arrangement for generating a magnetic force having a predetermined magnetic intensity is provided on at least one of the electrode and the sample stage. Due to the magnetic force generated by the arrangement and a difference in pressure between a pressure of the atmosphere in the reaction container and a pressure of the reaction gas supplied from the reaction gas supply portion, one of the electrode and the sample stage is floated with respect to the other: there is a micro gap between the electrode and the sample; and a surface opposed to the sample of the electrode functions as the wall surface.

In one embodiment of this invention, a power transmission line is provided in the electrode. The power transmission line has an open end at a predetermined position of a portion opposed to the sample of the electrode. The power transmission line in the electrode transmits power applied to the electrode to the open end: a high electric field is generated at the open end by the transmitted power. The high-pressure plasma is generated in a vicinity of the open end by the high electric field.

In one embodiment of this invention, the power transmission line in the electrode includes an inner conductor for applying the power and an electric field shielding conductor which covers the inner conductor via an insulator and is connected to ground.

In one embodiment of this invention, the power app lied to the electrode is radio-frequency power having a frequency band of about 10 MHz to about 1 GHz, or microwave power having a frequency band of about 1 GHz or greater.

In one embodiment of this invention, the power transmission line comprises a waveguide which is provided in the electrode and has an open end at a predetermined position of a portion opposed to the sample of the electrode.

In one embodiment of this invention, the apparatus further includes a power absorber having a large absorption coefficient with respect to an electromagnetic wave having a frequency of a power supply used. The power absorber is provided in at least one of the electrode and the sample stage. The power absorber is provided at a region in the gas flow path having a low conductance having a pressure lower than the high-pressure plasma generated region. The power absorber absorbs an electromagnetic wave passing through the high-pressure plasma generated region to prevent plasma generation in the atmosphere in a region surrounding the high-pressure plasma.

In one embodiment of this invention, the apparatus further includes a discharging outlet having an opening which is directed to the micro gap between the electrode and the sample. The discharging outlet is provided in at least one of the sample stage or the electrode. A reaction product generated in the high-pressure plasma is discharged from the discharging outlet.

In one embodiment of this invention, a portion of a surface opposed to the sample of the electrode has a shape similar to a surface of the sample. The high-pressure plasma is generated in a flow along the surface of the sample from a high-pressure region in a vicinity of the reaction gas supply portion to the atmosphere around the electrode or to the discharging outlet.

In one embodiment of this invention, the apparatus according to claim 3 further includes a reaction container for maiintaining the predetermined atmosphere.

In one embodiment of this invention, the apparatus further includes a reaction container for maintaining the predetermined atmosphere; and a section for reprocessing a gas discharged from the reaction container or the discharging outlet and supplying the gas into the reaction container or the reaction gas supply portion again as the reaction gas or the atmosphere.

In one embodiment of this invention, the apparatus further includes a section for providing a relative movement between the sample and the high-pressure plasma so that the entire sample is subjected to surface treatment.

Thus, the invention described herein. makes possible the advantages of providing (1) a surface treatment method and apparatus using plasma in which film formation or surface modification is efficiently performed on a surface of a sample, and in clean atmosphere, film formation or surface modification is satisfactorily performed on a surface of a sample without attaching inappropriate reaction products onto the sample surface; and (2) a surface treatment method and apparatus using plasma in which the desired pressure of an atmosphere gas is lower than that of a plasma generating portion or is held under vacuum, so that film formation or surface. modification is uniformly performed on a sample having a large area without generating condensation of reaction products and without generating an uneven distribution of a film formation amount or treated layer thickness immediately under the reaction gas blowoff region.

These and other advantages of the present invention will become apparent to those skilled in the art upon reading and understanding the following detailed description with reference to the accompanying figures.

BRIEF DESCRIPTION OF THE DRAWINGS

FIG. 7A is a cross-sectional view illustrating an arrangement in the vicinity of a high-pressure reaction gas supply inlet 2.

FIG. 7B is a cross-sectional view showing a film thickness distribution generated immediately under the high-pressure reaction gas supply inlet 2 when local high-pressure plasma P is generated in the vicinity of the high-pressure reaction gas supply inlet 2 by utilizing the arrangement shown in FIG. 7A.

FIG. 7C is a diagram illustrating the state of a gas flow generated in the micro gap D in the case of FIG. 7B.

FIG. 8A is a cross-soctional view illustrating an arrangement in the vicinity of a high-pressure reaction gas supply inlet 2 and a power transmission line 7 when the power transmission line 7 is positioned away from the high-pressure reaction gas supply inlet 2.

FIG. 8B is a cross-sectional view showing a film thickness distribution generated immediately under the power transmission line 7 when local high-pressure plasma P is generated in the vicinity of the power transmission line 7 by utilizing the arrangement shown in FIG. 8A.

FIG. 8C is a diagram illustrating the state of a gas flow generated in the micro gap D in the case of FIG. 8B.

FIG. 20C is a plan view illustrating a sample floating type high-pressure floating electrode H4 in which a power transmission line includes a waveguide.

DESCRIPTION OF THE PREFERRED EMBODIMENTS

Before describing concrete embodiments of the present invention, a method for generating a flow field of a high-pressure reaction gas will be explained with reference to FIGS. 22 and 23. The flow field is generated in such a manner that the reaction gas is locally supplied to the vicinity of a sample provided under atmosphere.

Figure 22:
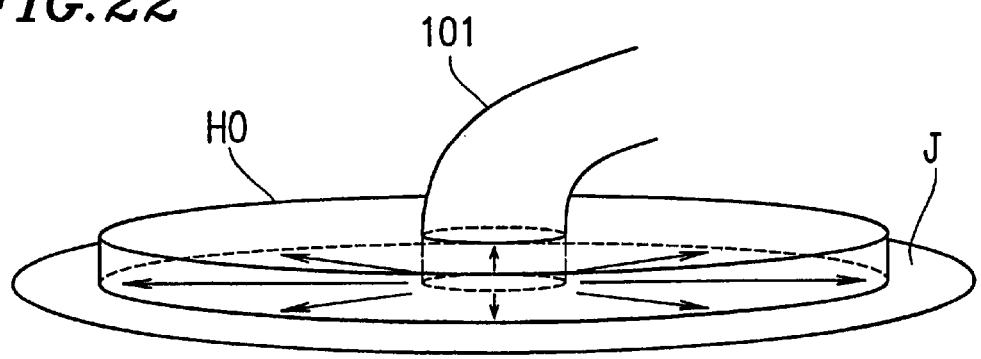
FIG. 22 is a diagram illustrating generation of a flow field of a gas due to a circular plate H0.
Figure 23:
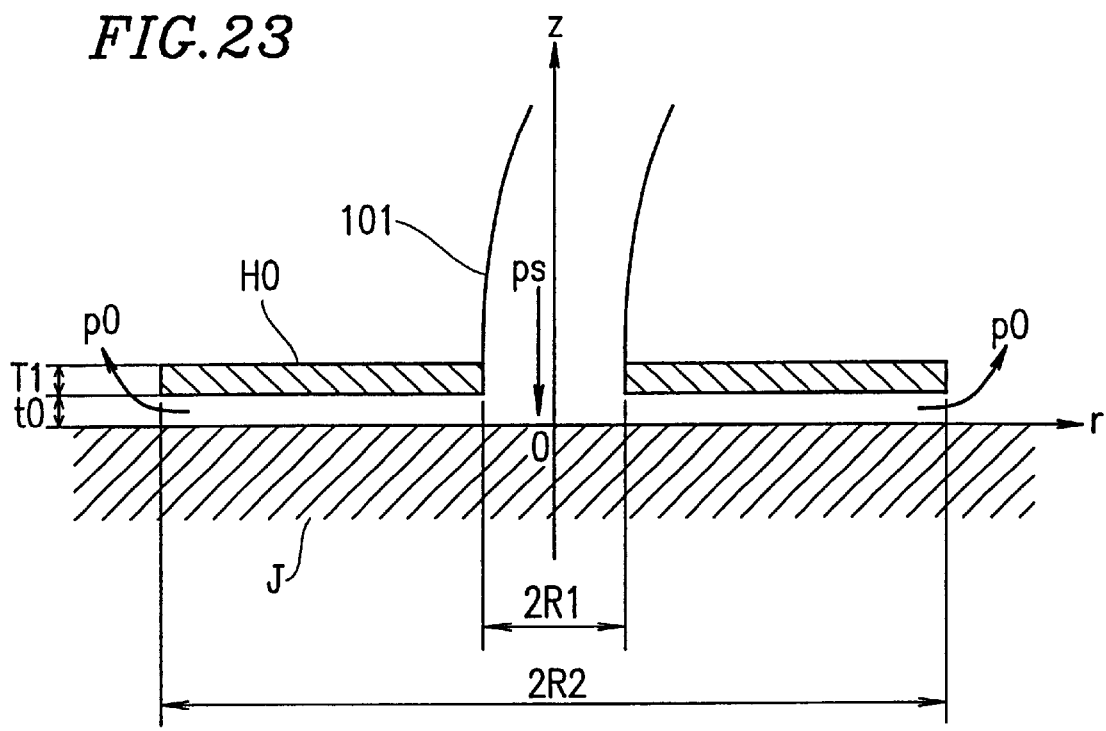
FIG. 23 is a cross-sectional view of an arrangement shown in FIG. 22, in which a cylindrical coordinate system is provided between the circular plate H0 and a sample on which a film is to be formed.
Figure 24:
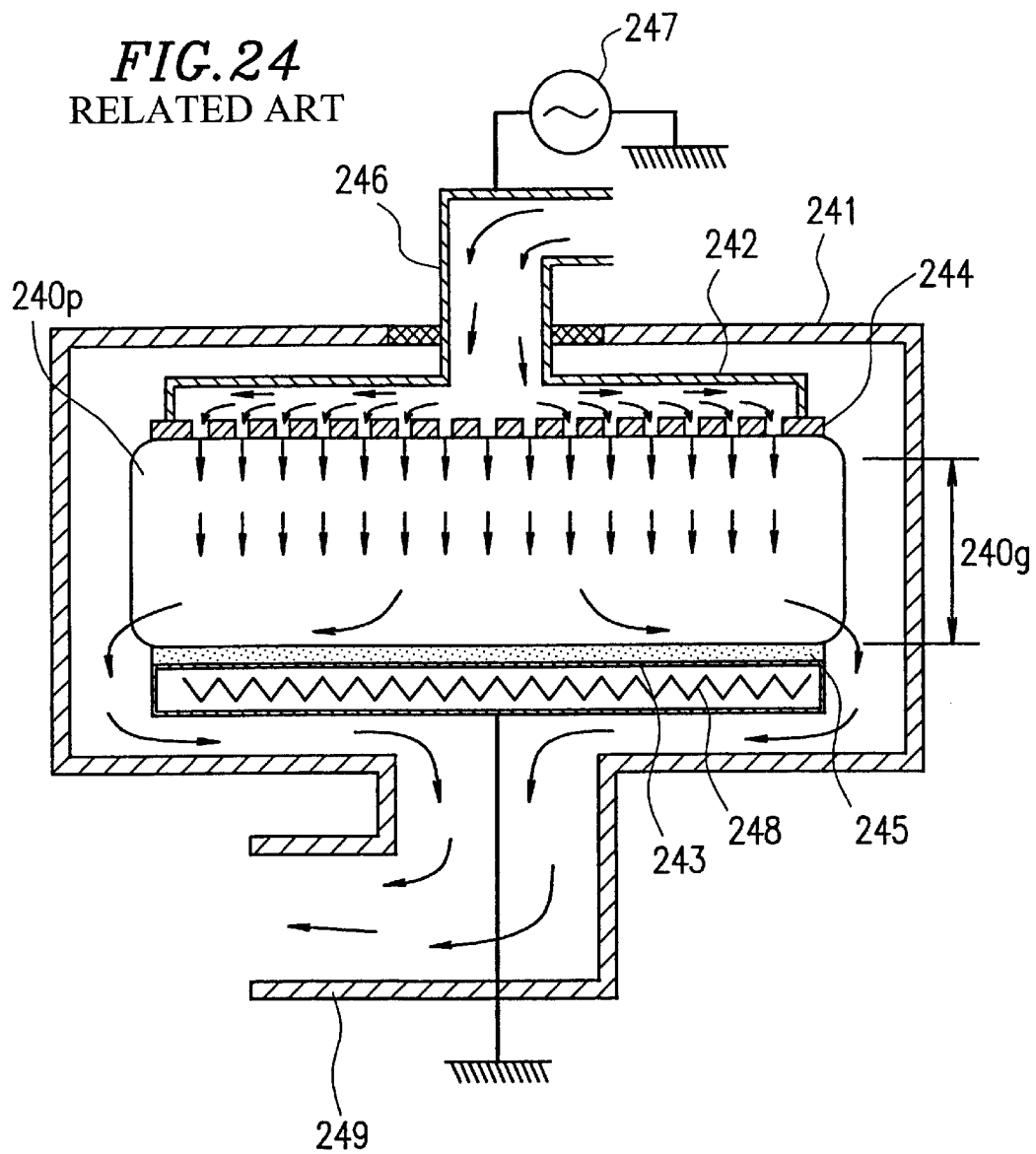
FIG. 24 is a cross-sectional view illustrating a configuration of a conventional surface treatment apparatus using plasma.
Figure 25:
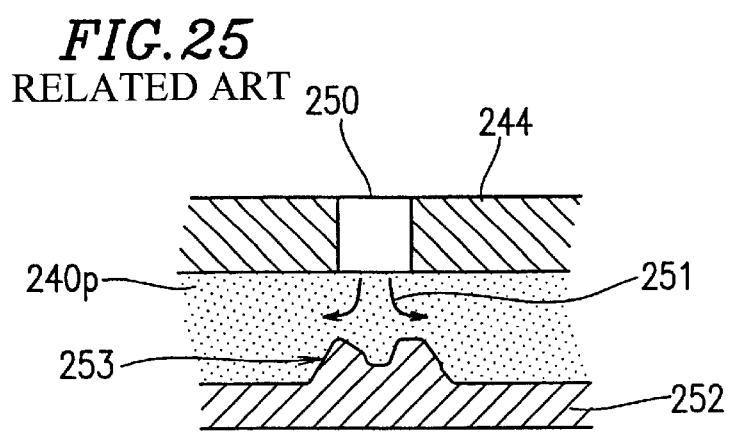
FIG. 25 is a diagram showing a film thickness distribution of a thin film which is believed to be formed immediately under a material gas supply inlet.

FIGS. 22 and 23 are diagrams illustrating formation of the flow field of the gas due to a circular plate H0.

Specifically, when a target film formation sample J has a flat surface on which a film is formed, the circular plate H0 is opposed to the target film formation sample J with a gap to in between. A high-pressure gas having a pressure of ps is locally supplied to the target sample J via a hole having an inner radius of R1 of a high-pressure gas supply path 101. The circular plate H0 is flat-shaped and has an outer radius R2, an inner radius R1, and a thickness of T1. The high-pressure gas flows through a gas flow path provided between the circular plate H0 and the target film formation sample J to an atmosphere having a pressure of P0 which surrounds the circular plate H0.

A weight flow amount w and pressure distribution p of a gas flowing between the circular plate H0 and the target film formation sample J is calculated using FIG. 23. In FIG. 23, a cylindrical coordinate axis is provided between the circular plate H0 and the target film formation sample J.

As shown in FIG. 23, the z axis is represented by a line which is perpendicular to the target film formation plane and the circular plate H0 and passes through the center of the circular plate H0. The origin O is represented by a point of intersection of the z axis and the target film formation plane. The r axis is represented by a line which passes through the origin O and is on the target film formation plane as shown in FIG. 23. An angle θ0 of rotation is defined as an angle in a counterclockwise direction from the r axis.

The weight flow amount w of a gas flowing between the circular plate H0 and the target film formation sample J is first calculated. The gas flow amount w is calculated using a flow rate defined by Navier-Stokes equations which are equations of motion of gas where viscosity is taken into account. The Navier-Stokes equations are represented by a cylindrical coordinate system in the following expression (1).

$$\rho\left(\frac{\partial u_r}{\partial t} + u_r\frac{\partial u_z}{\partial r} + \frac{u_\theta}{r}\frac{\partial u_z}{\partial \theta} + u_z\frac{\partial u_z}{\partial z} - \frac{u_\theta^2}{r}\right) = \rho F_r - \\ \frac{\partial p}{\partial r} + \\ \mu\left(\frac{\partial^2 u_r}{\partial r^2} + \frac{1}{r}\frac{\partial u_r}{\partial r} - \frac{u_r}{r^2} + \frac{1}{r^2}\frac{\partial^2 u_r}{\partial \theta^2} - \frac{2}{r^2}\frac{\partial u_\theta}{\partial \theta} + \frac{\partial^2 u_r}{\partial z^2}\right) \\ \rho\left(\frac{\partial u_\theta}{\partial t} + u_r\frac{\partial u_\theta}{\partial r} + \frac{u_\theta}{r}\frac{\partial u_\theta}{\partial \theta} + u_z\frac{\partial u_\theta}{\partial z} + \frac{u_r u_\theta}{r}\right) = \rho F_\theta - \\ \frac{1}{r}\frac{\partial p}{\partial \theta} + \\ \mu\left(\frac{\partial^2 u_\theta}{\partial r^2} + \frac{1}{r}\frac{\partial u_\theta}{\partial r} - \frac{u_\theta}{r^2} + \frac{1}{r^2}\frac{\partial^2 u_\theta}{\partial \theta^2} + \frac{2}{r^2}\frac{\partial u_r}{\partial \theta} + \frac{\partial^2 u_\theta}{\partial z^2}\right) \\ \rho\left(\frac{\partial u_z}{\partial t} + u_r\frac{\partial u_z}{\partial r} + \frac{u_\theta}{r}\frac{\partial u_z}{\partial \theta} + u_z\frac{\partial u_z}{\partial z}\right) = \rho F_r - \frac{\partial p}{\partial z} + \\ \mu\left(\frac{\partial^2 u_z}{\partial r^2} + \frac{1}{r}\frac{\partial u_z}{\partial r} + \frac{1}{r^2}\frac{\partial^2 u_z}{\partial \theta^2} + \frac{\partial^2 u_z}{\partial z^2}\right)$$

Expression (1)

To obtain the gas flow amount w flowing between the circular plate H0 and the target film formation sample J, the following assumption is made:

(1) a distance t0 between the circular plate H0 and the target film formation sample J is very small compared with the outer radius R2 of the circular plate H0;
(2) the flow between the circular plate H0 and the target film formation sample J is a developed boundary-layer flow;
(3) there is substantially no pressure distribution in the z axis direction, so that the velocity of the gas in the z axis direction is negligible;
(4) there is substantially no pressure distribution in the θ axis direction, so that the velocity of the gas in the θ axis direction is negligible;
(5) an inertia term is small compared with a pressure gradient term; and
(6) a major viscosity term is only $\delta^2 V_r/\delta z^2$, so that other viscosity terms are ignored.

The above-described assumption is applied to expression (1), resulting in the following simplified expression (2).

$$\frac{\partial p}{\partial r} = \mu\left(\frac{\partial^2 u_r}{\partial z^2}\right) \qquad \text{Expression (2)}$$

where p is a pressure distribution in the r direction, $V_r$ is a flow rate distribution in the r direction, and $\mu$ is a viscosity coefficient of the gas.

At a wall, the velocity of the gas is assumed to be equal to the velocity of the wall. The boundary condition is as follows:

$$\begin{cases} z = 0 & u_r = 0 \\ z = t0 & u_r = 0 \end{cases} \qquad \text{Expression (3)}$$

The pressure p has substantially no distribution in the z direction. Expression (2) is solved using the boundary condition represented by expression (3). The following expression (4) is obtained.

$$u_r = \frac{1}{2\mu}\left(\frac{\partial p}{\partial r}\right)(z^2 - t0z) \qquad \text{Expression (4)}$$

The weight flow amount w of the gas flowing between the circular plate H0 and the target film formation sample J is represented by the following expression (5):

$$w = 2\pi r \rho \int_{z=0}^{z=t0} u_r dz = -\frac{\pi}{6\mu}r t_0^3 \rho\left(\frac{\partial p}{\partial r}\right) \qquad \text{Expression (5)}$$

where ρ is the density of the gas.

On the other hand, the following expression (6) is obtained by a state equation of gas:

$$\rho = \frac{pm}{R0T0} \qquad \text{Expression (6)}$$

where m is the molecular weight, R0 is a gas constant, and T0 is an absolute temperature. If expression (6) is substituted into expression (5), then the following expression (7) is obtained:

$$w = -\frac{\pi}{6\mu}\frac{m}{R0T0}r t_0^3 p\left(\frac{\partial p}{\partial r}\right) \qquad \text{Expression (7)}$$

where w must be constant regardless of r. Accordingly, the following expression (8) is obtained.

$$rp\left(\frac{\partial p}{\partial r}\right) = \text{const} = E0 \quad \begin{cases} r = R1 & p = ps \\ r = R2 & p = p0 \end{cases} \qquad \text{Expression (8)}$$

From expression (8), expression (9) is obtained:

$$p^1 \cong 2E0 \times \log[r] + F0 \qquad \text{Expression (9)}$$

where E0 and F0 are integral constants. This is substituted into the boundary condition, so that the following expressions (10) and (11) are obtained.

$$p = \sqrt{\frac{(ps^2 - p0^2)\log[r] + p0^2\log[R1] - ps^2\log[R2]}{\log[R1] - \log[R2]}} \qquad \text{Expression (10)}$$

$$w = \frac{\pi}{12\mu}\frac{m}{R0T0}\frac{t0^3}{\log[R2/R1]}(ps^2 - p0^2) \qquad \text{Expression (11)}$$

A force acting on the lower surface of the circular plate H0 due to a gas pressure between the circular plate H0 and the target film formation sample J is obtained by the integral of expression (10), i.e., the following expression (11).

$$f1 = \int_{r=R_1}^{r=R_2} 2\pi rp dr \qquad \text{Expression (12)}$$

A pressure p0 of ambient atmosphere acts on the upper surface of the circular plate H0. Therefore, a force f represented by the following expression (13) acts on the circular plate H0 in the positive direction along the z axig, excluding a gravitational force.

$$f = f1 - \pi R2^2 p0 \qquad \text{Expression (13)}$$

From expression (11), the following expressions (14), (15), and (16) are obtained.

$$\frac{w}{c} = (ps^2 - p0^2) \qquad \text{Expression (14)}$$

$$c = \frac{\pi}{12\mu} \frac{m}{ROT0} \frac{t0^3}{\log[R2/R1]} \qquad \text{Expression (15)}$$

$$w = C0(ps - p0) \qquad \text{Expression (16)}$$

In expression (16), w is the weight flow amount and ps−p0 is a difference in pressure. Thus, C0 represents conductance, which is represented by the following expression (17).

$$C0 = \frac{\pi}{12\mu} \frac{m}{ROT0} \frac{t0^3}{\log[R2/R1]}(ps + p0) \qquad \text{Expression (17)}$$

The conductance C0 of the gas flow path between the circular plate H0 and the target film formation sample J varies depending on the pressures ps and p0. When the conductance C0 is set in accordance with a geometrical boundary condition, the conductance C0 depends on t0, R2, and R1.

In the foregoing, when the gas pressure for generating plasma is set to a high pressure around atmospheric pressure so that a number of gas molecules are supplied into the plasma and a high film formation rate is achieved, this method is the same as the above-described conventional method.

It is now assumed that a supplied gas has a pressure of ps1; a required and predetermined flow amount of the gas is w1: a pressure p0 of ambient atmosphere surrounding the circular plate H0 is p01: a constant c which is determined by the physical properties of the gas and the boundary conditions R1, R2, t0 of the circular plate H0 is equal to c1; and a conductance C0 is equal to C01.

The type (molecular weight m) of the supplied gas for generating plasma, the pressure (ps), and temperature (T) cannot be varied, since these are determined by the target film formation sample J, a target film specification, a plasma phenomenon, and the like. Variable parameters are the pressure p0 of ambient atmosphere surrounding the circular plate H0, and the arrangement of the circular plate H0, i.e., the boundary conditions R1, R2, and t0.

It is initially discussed when R1, R2, and to are designed so that c=c1 is very large. This is achieved where the width t0 of the gas flow path from the supply portion to the peripheral of the circular plate H0 is increased and R2/R1 is increased so that the conductance C0 of the gas flow path from the high-pressure reaction gas supply portion to the ambient atmosphere is high (C0=C01).

According to expressions (14) and (15), ps1=p01. The pressure ps of the high-pressure gas supply portion is thus equal to the pressure p0 of ambient atmosphere surrounding the circular plate H0. According to expression (10), p≈ps≈p0 (R1≦R≦R2). There is thus substantially no pressure distribution generated between the circular plate H0 and the target film formation sample J, i.e. the gas flow path from the high-pressure supply portion to the ambient atmosphere.

Next, it is discussed when the required gas supply amount w1 and the supplied gas pressure ps1 are held constant; the conductance C0 is decreased so that C0=C02 (C0>C02): and accordingly the ambient atmosphere pressure p0 is set to be small (p0=p02<ps1≅p01).

In this case, according to expressions (14) and (15), C02 and p02 are set so that the gas flow amount w is w=w1=c2 (ps1²−p02²) And ps1>p02 is satisfied where ps1 is the supply portion pressure, and p02 is the ambient atmosphere pressure of the circular plate H0. The pressure distribution represented by expression (10) is thus generated between the circular plate H0 and the target film formation sample J, i.e., the low conductance flow path portion. Accordingly, the pressure between the circular plate H0 and the target film formation sample J is high in any portion thereof, since the pressure p0 of ambient atmosphere surrounding the circular plate H0 is equal to p02.

In view of the foregoing points, there are two methods for supplying a gas with a constant pressure ps1 and a constant supply amount w1:

(1) a gas flow field (the above-described wall surface H0) is designed so that the conductance of the gas flow path from the supply portion to the ambient atmosphere is large; and thus a gas flows under a condition such that the supply pressure ps is substantially equal to the ambient pressure p0; and (2) the above-described H0 is designed so that the above-described conductance is decreased; and thus a gas, flows under a condition such that a difference in pressure between the supply pressure ps and the ambient pressure p0 is large.

Further, it is discussed when a high-pressure gas having an increased ps is supplied into plasma generated between the circular plate H0 and the target film formation sample J so that a high film formation rate can be achieved.

As described above, in either case of (1) and (2), a gas flowing between the circular plate H0 and the target film formation sample J has the same flow amount w=w1, so that the same film formation rate is obtained.

In the above-described case (1), the supply portion pressure ps, the pressure between the circular plate H0 and the target film formation sample J, and the ambient pressure p0 do not have a pressure distribution, thereby being substantially equal to each other. Since the plasma portion has a high pressure, the mean free path of a particle is short. For this reason, particles easily collide with each other and are condensed to form a reaction product. Such a reaction product is quickly decomposed in the plasma and thus does not contaminate a target surface for film formation. However, in the ambient atmosphere, since the ambient atmosphere has almost the same high pressure as that of the plasma portion, the mean free path of a particle is short. For this reason, particles highly repeatedly collide with each other and are condensed to form a reaction product having a large grain diameter. The reaction product having a large grain diameter is not quickly decomposed even when being diffused into the plasma due to its largeness. Such a large reaction product is attached and taken into a target surface for film formation, resulting in degradation in film quality. The reaction product is attached onto the film surface after the film formation. The film surface is easily contaminated, whereas the high film formation rate is achieved. As described above, the reaction product generated in the plasma is quickly decomposed, so that the reaction product cannot be grown to a powder-like reaction product. The above-described problem is ascribable to the reaction product having a large grain diameter which is grown due to the high pressure outside the plasma.

When the ambient atmosphere pressure p0−p01 is decreased so as to prevent occurrence of the reaction product, the pressure in the plasma portion also is reduced since the supply portion pressure ps, the pressure between the circular plate H0 and the target film formation sample J, and the ambient pressure p0 are substantially equal to each other. As a result, satisfactory film quality and a clean surface can be obtained, but a high film formation rate cannot be achieved.

Thus, in the above-described case (1), the high film formation rate and the clean surface cannot be simultaneously obtained.

On the other hand, in the above-described case (2), a constant gas supply amount wl for achieving a high film formation rate is obtained. The conductance C0 of the gas flow path is low, so that the ambient atmosphere pressure p02 is held ps>p02 with respect to the supply portion pressure ps. In this situation, the reaction product generated in the plasma is quickly decomposed as in the above-described case (1), so that the film formation surface is not contaminated. Further, in the above-described case (2), the ambient atmosphere pressure is lower than the pressure between the circular plate H0 and the target film formation sample J, so that the mean free path is relatively large. The collision and condensation of the reaction product do not thus easily occur. The reaction product is not grown to have a large grain diameter. Therefore, clean film formation can be achieved.

As described above, in the case (2), the plasma portion is designed to have a high pressure, so that a high film formation rate is achieved. At the same time, satisfactory film quality and a clean surface can be obtained since the ambient atmosphere has a pressure lower than that in the plasma portion.

The smaller the ambient pressure p0, the cleaner the film formation. The minimum value of p0 is 0, i.e., the ambient portion is in a vacuum state.

The above-described oases (1) and (2) have the following results shown below in Table 4 where the supply pressure ps, the ambient atmosphere pressure p0, the weight flow amount w, the conductance C0, and the constant c are given.

TABLE 4

| Condition | Pressure supplied ps | Pressure of atmosphere pO | Conductance CO | Flow amount by weight w | Film formation rate | Cleanness and film quality of surface of a formed film |
|---|---|---|---|---|---|---|
| ① | ps1 | pO1 (≈ps1) | CO1 | w1 | ① and ② have the same film formation rate | Bad |
| ② | ps2 | pO2 (<pO1) | CO2 (<CO1) | w1 | | Good |

In this invention, the gas flow path from the high-pressure gas supply portion to the circular plate H0 is formed between the circular plate Ho having the inner radius R1 and the outer radius R2, and the target film formation sample J opposed to the circular plate H0 with a gap to in between. The conductance of the gas flow path is calculated by Navier-Stokes equations (expression (1)) which are equations of motion for a viscous gas.

A difference in pressure between the high-pressure gas supply portion and the ambient atmosphere is generated by forming a flow field of a gas from the the high-pressure gas supply portion to the ambient atmosphere and reducing the conductance of the flow field. To this end, the gap to between the circular plate H0 and the target film formation sample J is decreased and R2/R1 is increased. This invention is not, however, limited to this. When a flowing gas has a low pressure, in fact, the conductance C0 of the gas is calculated using the kinetic theory of gas, not the above-described Navier-Stokes equations. Regardless of a method for calculating the conductance C0, the gas flow path from the high-pressure gas supply portion to the ambient atmosphere is designed to have a low conductance, so that a clean surface is formed at a high film formation rate as shown in the case (2).

Hereinafter, a surface treatment (film formation or surface modification) method and apparatus using plasma according to this invention which are achieved based on the above-described discussion will be described with reference to the accompanying drawings.

EXAMPLE 1

Figure 1:
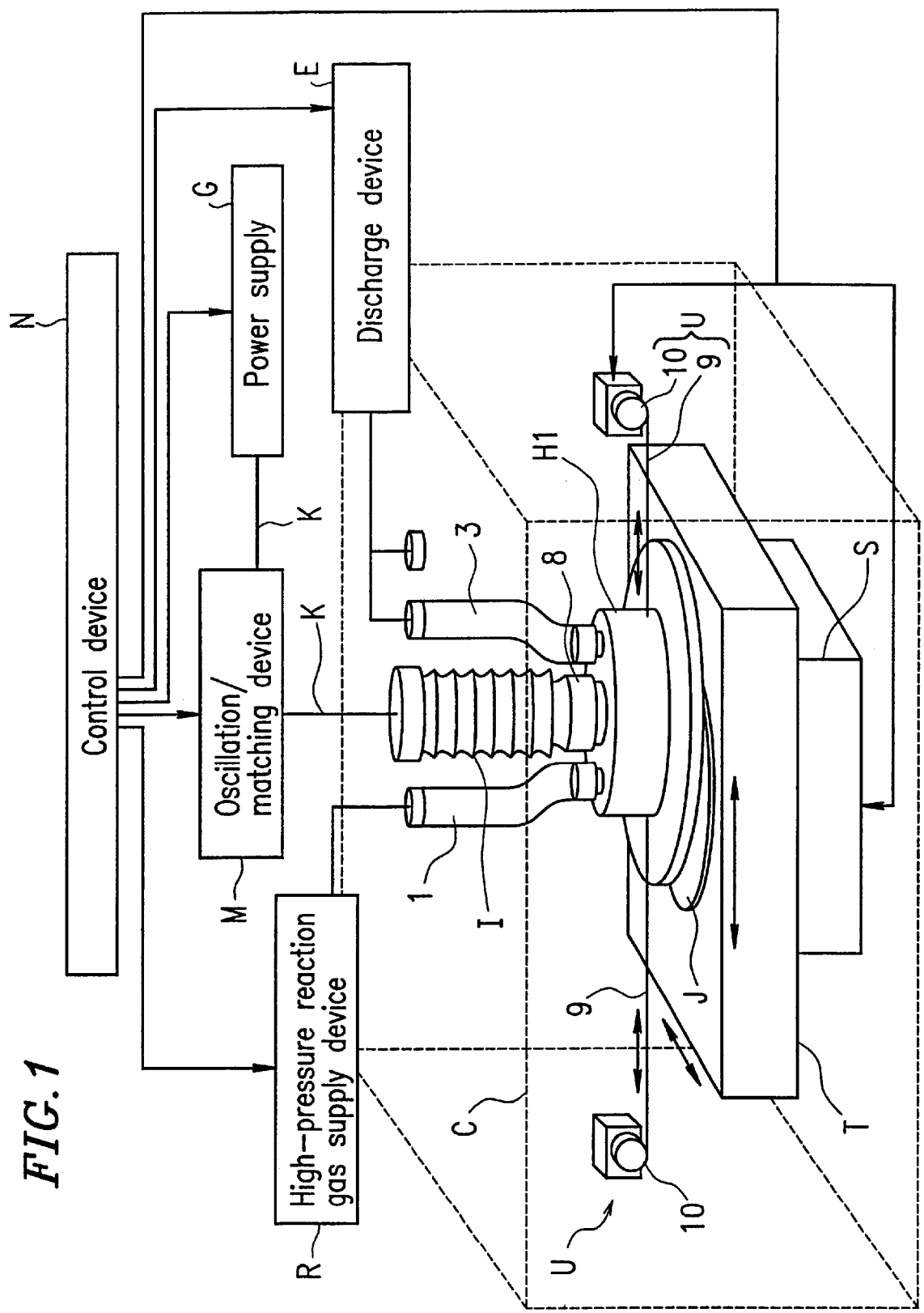
FIG. 1 is a conceptual diagram illustrating a whole apparatus according to the present invention.

FIG. 1 is a conceptual overview illustrating the arrangement of an electrode floating type high-pressure floating electrode H1, a sample J, a sample stage T, a scanning stage S, a reaction container C, a power supply G, an oscillation/matching device M, a flexible power transmission line I, a power transmission line K, a high-pressure reaction gas supply device R, a gas discharging device E, an electrode scanningdevice U, and a control device N for controlling the former portions. A device (not shown) for measuring a gap between the sample J and the electrode H1 is provided. For the electrode H1 and the sample stage T, a cooling or heating arrangement (not shown) for adjusting the respective temperature is provided. The sample stage T includes a sample fixing portion F (FIG. 2).

Figure 2:
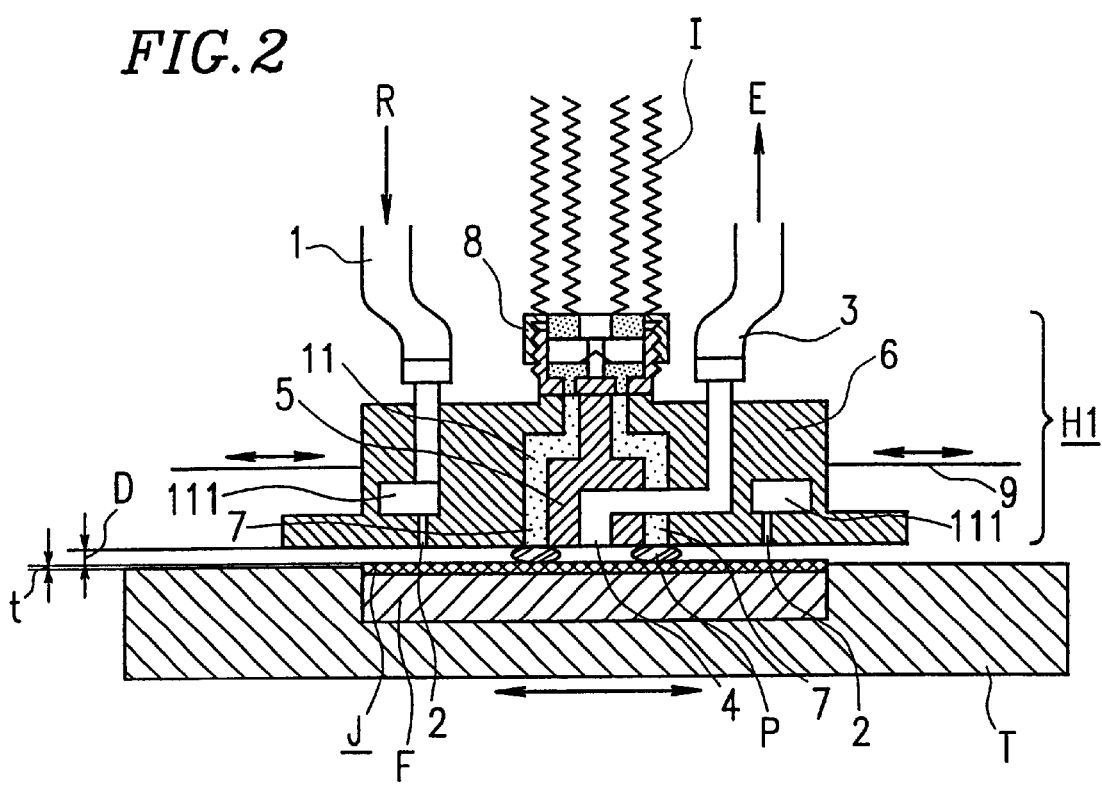
FIG. 2 is a cross-sectional view illustrating an electrode floating type high-pressure floating electrode H1.

FIG. 2 is a cross-sectional view illustrating the above-described electrode floating type high-pressure floating electrode H1.

In FIG. 2, a high-pressure reaction gas is transported from the high-pressure reaction gas supply device R to the electrode floating type high-pressure floating electrode H1 via a high-pressure reaction gas supply path 1. A reaction gas supply inlet 2 is provided on the electrode floating type high-pressure floating electrode H1, facing the sample J. The high-pressure reaction gas transported from the high-pressure reaction gas supply device R is blown off from the reaction gas supply inlet 2. A buffer portion 111 prevents occurrence of distribution of the pressure of the reaction gas supplied from the reaction gas supply inlet 2. A plurality of the buffer portions 111 in FIG. 2 are actually joined with each other. A reaction gas discharging outlet 4 is connected via a reaction product discharging path 3 to the gas discharging device B. A reaction product generated in a high-pressure plasma P generated locally (hereinafter is also referred to as a "local high-pressure plasma P") is discharged from the reaction gas discharging outlet 4. The electrode floating type high-pressure floating electrode H1 includes inner and outer electrodes 5 and 6. The inner and outer electrodes 5 and 6 are insulated from each other by an insulator 11. A power transmission line open end 7 is formed by the inter and outer electrodes 5 and 6 and the insulator 11. The electrode floating type high-pressure floating electrode H1 and the flexible power transmission line I are connected to each other via a connector 8. The electrode floating type high-pressure floating electrode Hi and a driving motor 10 are connected to each other via a scanning wire or belt 9. The electrode floating type high-pressure floating electrode H1 is moved with respect to the sample J via the scanning wire (belt) 9 by rotating the driving motor 10. A combination of the scanning wire (belt) 9 and the driving motor 10 is referred to as the scanning device U.

Figure 3:
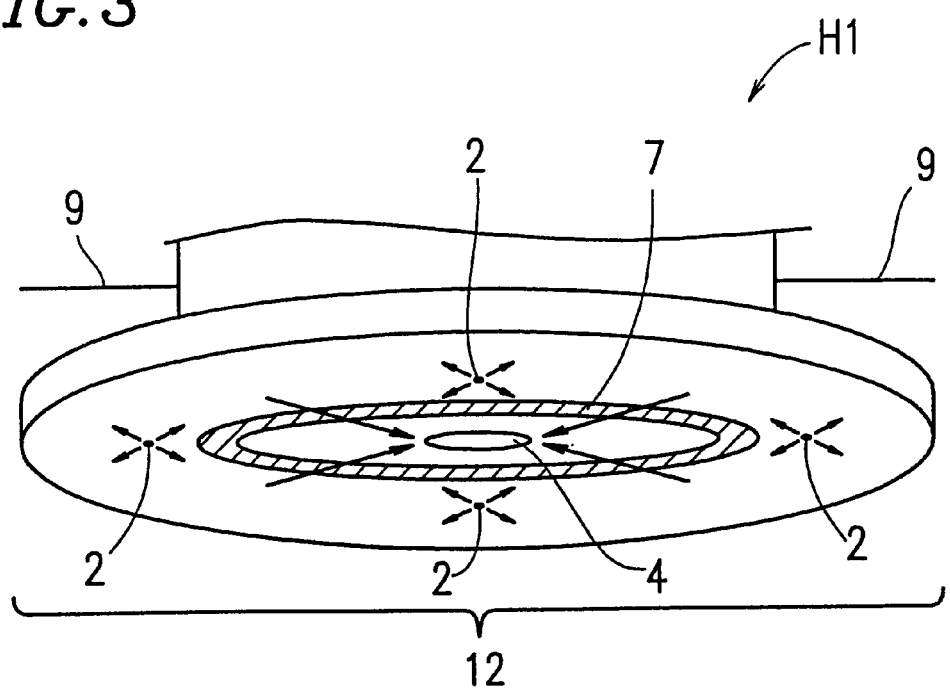
FIG. 3 is a diagram illustrating a portion opposed to a sample of the electrode floating type high-pressure floating electrode H1, viewed obliquely from below.

FIG. 3 is a diagram illustrating a portion of the electrode floating type high-pressure floating electrode H1, facing the sample, viewed obliquely from below.

As shown in FIG. 3, the electrode floating type high-pressure floating electrode H1 has a disk-like shape at the center of which the reaction product discharging outlet 4 is positioned. A number of the high-pressure reaction gas supply inlets 2, which are micro holes shown in FIG. 3, are provided on the circumference of a circle. Preferably, these micro holes are arranged so that a gas supplied from the micro holes has a uniform pressure distribution (flow amount distribution). Specifically, the micro holes are preferably spaced equally on the circumference of a given circle. The power transmission line open end 7 for generating the local high-pressure plasma P has a shape of the circumference of a circle, and is provide closer to the reaction gas discharging outlet 4 than to the high-pressure reaction gas supply inlet 2, but positioned sufficiently away from the reaction gas discharging outlet 4 and the high-pressure reaction gas supply inlet 2.

Figure 4:
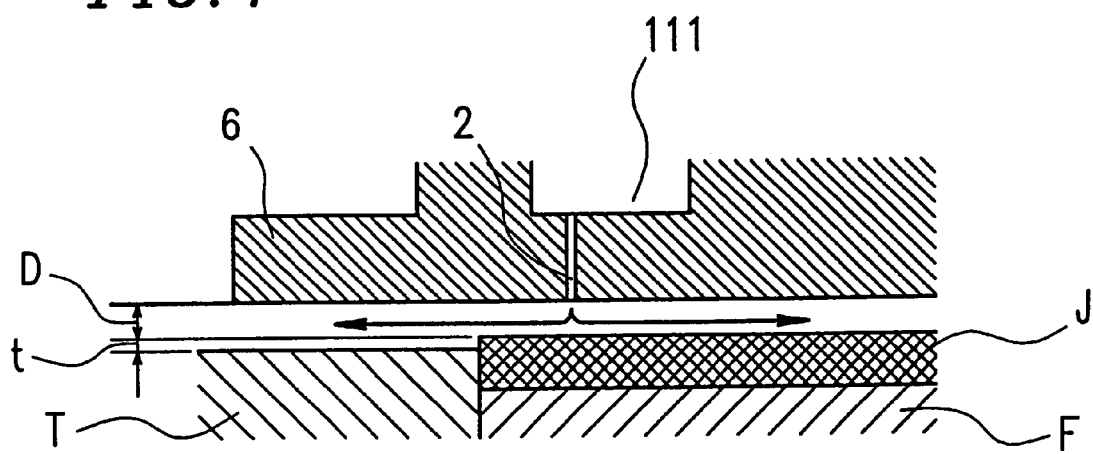
FIG. 4 is a partial cross-sectional view illustrating a step t between a sample J and a sample stage T.

FIG. 4 is a partial cross-sectional view illustrating a step t between the sample J and the sample stage T.

In Example 1 of this invention, the sample J and the electrode floating type high-pressure floating electrode H1 are opposed to each other in the reaction container C. The high-pressure reaction gas which is determined based on target film properties and the like is supplied from the high-pressure reaction gas supply device R to the electrode floating type high-pressure floating electrode H1 via the high-pressure reaction gas supply path 1. The high-pressure floating electrode H1 is floated by a micro gap D with respect to the sample J by supplying the high-pressure reaction gas to a portion of the high-pressure floating electrode H1 facing the sample J from the high-pressure reaction gas supply inlet 2. In the above-described structure, the gap D between the electrode H1 and the sample J is sufficiently small that the gas supplied into this region is unlikely to flow into atmosphere surrounding the electrode H1. Therefore, the region between the electrode H1 and the sample J is held at high pressure.

Thus, as described in connection with the pressure difference generating theory in the low conductance gas flow path (the pressure difference between the supply pressure ps and the ambient pressure p0 is utilized as in the above-described case (2)), the portion of the high-pressure floating electrode H1 facing the sample J serves as the wall surface which causes the gas flow path from the high-pressure reaction gas supply inlet 2 to the atmosphere in the reaction container C to have a low conductance. This low conductance locally forms a reaction gas region having a pressure (high-pressure reaction gas region) higher than the pressure of a gas in the reaction container C from which the gas is discharged by the gas discharging device E in a low conductance portion of the micro gap D between the high-pressure floating electrode H1 and the sample J.

Power generated by the power supply G is transmitted to the high-pressure floating electrode H1 via the power transmission line K, the oscillation/matching device M, and the flexible power transmission line I. The power is further transmitted via a power transmission line in the electrode including the inner and outer electrodes 5 and 6 and the insulator 11 to the power transmission line open end 7. The power transmission line open end 7 is positioned at the portion of the high-pressure floating electrode H1 facing the sample J and is positioned away from the high-pressure reaction gas supply inlet 2. This generates a high electric field which in turn generates the local high-pressure plasma P at the position of the power transmission line open end 7, i.e., a portion in the high-pressure reaction gas region in the micro gap D between the high-pressure floating electrode E1 and the sample J and away from the high-pressure reaction gas supply inlet 2. The. high-pressure reaction gas is decomposed and activated in the local high-pressure plasma P and a film is formed on the sample J immediately under the plasma P.

A reaction product generated by the plasma P is quickly discharged by the gas discharging device B via the reaction product discharging path 3 out of the reaction product discharging outlet 4. The reaction product which flows into the atmosphere in the reaction container C is eliminated by discharging the atmosphere out of the entire reaction container C by the gas discharging device E.

In the above-described structure, the relative position between the high-pressure floating electrode H1 and the sample J is varied using the scanning device U and the scanning stage S. This allows film formati-on over the entire surface of the sample J. Further, by means of the control device N, the desired film formation can be performed.

In the above-described structure, the local high-pressure plasma P is generated in the high-pressure atmosphere in the micro gap D between the high-pressure and electrode H1 facing the sample J. For this reason, active seeds are generated in high density, resulting in a high film formation rate. At the same time, the pressure in the reaction container C (the pressure of the ambient atmosphere) is held lower than the high-pressure atmosphere between the high-pressure floating electrode H1 and the sample J or under vacuum. Therefore, as described above, the reaction product is not grown to have alarge grain diameter. A high-quality film can be formed on the sample J. and a surface of the film can be held clean.

The smaller the pressure; of the reaction container C, the cleaner the surface of the film and the higher the qualityof filmformation. In particular, when the reaction container C is under vacuum, the maximum effect can be obtained.

When the pressure of the reaction container C is smaller than or equal to about one atmospheric pressure, the pressure of the reaction container C is lower than the atmospheric pressure outside the reaction container C. The atmosphere in the reaction container C substantially does not leak outside, thereby enhancing the safety of the apparatus.

When the reaction container C is under vacuum, it takes a very short time to purge the reaction gas in removing the sample J out of the reaction container C. Alternatively, the purging may not be required. The throughput of the apparatus is improved.

As described above, the electrode H1 is floated with respect to the sample J due to the pressure difference between the high pressure in the micro gap D and the pressure of the atmosphere in the reaction container C (ambient atmosphere). Therefore, the electrode H1 is not tilted with respect to the sample J, keeping the micro gap D. Further, in the above-described micro gap D, the reaction gas smoothly flows from the high-pressure reaction gas supply inlet 2 to the atmosphere in the reaction container C or to the reaction product discharging outlet 4 along the surface of the sample J. The local high-pressure plasma P is generated in the micro gap D where the smooth flow is generated, so that a film having a uniform distribution of film thickness can be obtained.

Further, the local high-pressure plasma P is not generated immediately under the high-pressure reaction gas supply inlet 2, but is generated at a portion away from the inlet 2. For this reason, due to a blow-off stream of the reaction gas from the inlet 2, there is substantially no formation of a film formation amount distribution such that the film formation amount immediately under the inlet 2 is greater than the film formation amount around the inlet 2. Thus, film formation can be performed in such a way to obtain a uniform film thickness distribution.

Further, the following effects are described in detail:

(1) a method for floating the electrode H1 with respect to the sample J by the micro gap D, and effects thereof;

(2) a method for generating the plasma P at the position of the power transmission line open end 7, and effects thereof;

(3) a method for obtaining a high-quality film and a clean surface of a film; and (4) a method for preventing formation of a film formation distribution immediately under the gas supply inlet 2.

Initially, (1) a method for floating the electrode H1 with respect to the sample J by the micro. gap D will be described.

Figure 5A:
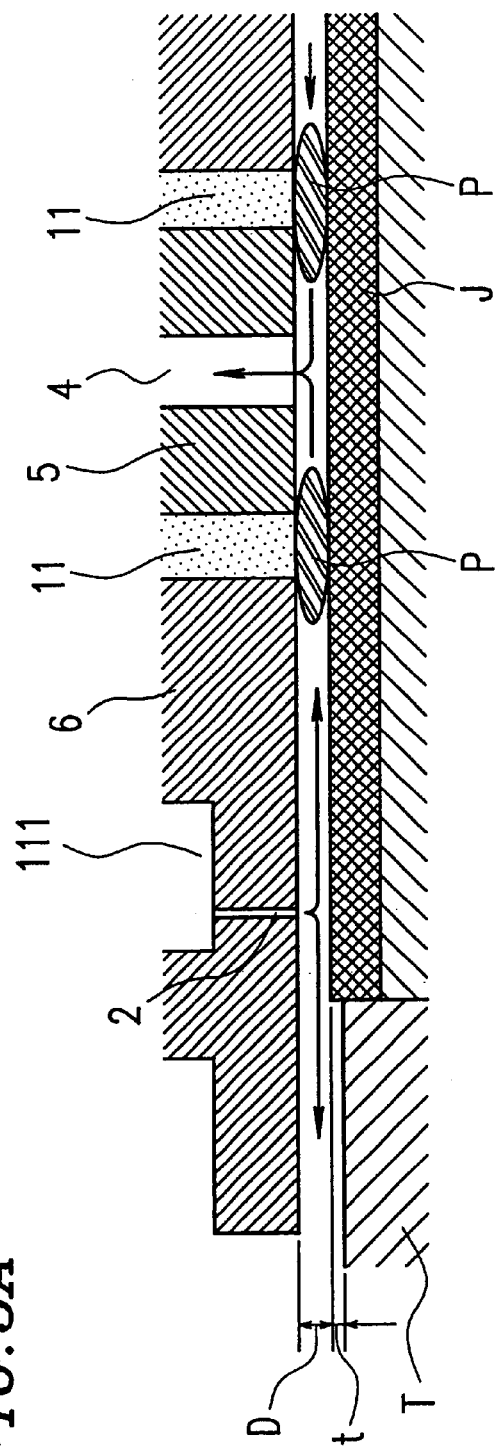
FIG. 5A is a cross-sectional view illustrating the vicinity of a micro gap D between the electrode floating type high-pressure floating electrode Hl and the sample J.
Figure 5B:
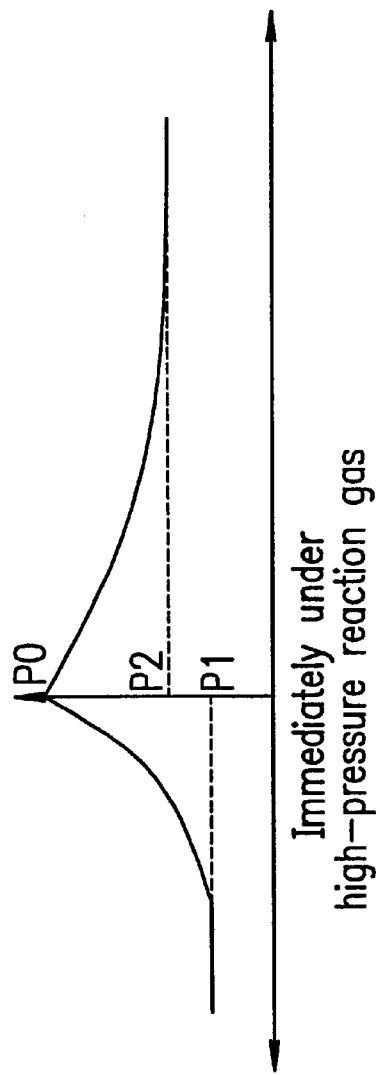
FIG. 5B is a diagram showing a pressure distribution of a high-pressure reaction gas in the micro gap D.

FIG. 5A is a cross-sectional view diagramatically showing the vicinity of the micro gap D between the electrode floating type high-pressure floating electrode H1 and the sample J. FIG. 5B is a diagram showing a pressure distribution of a high-pressure reaction gas in the above-described micro gap D. In FIG. 5B, P0 is the pressure of the high-pressure reaction gas supply inlet 2: P1 is the pressure of the atmosphere in the reaction container C; and P2 is the pressure of the reaction gas discharging output 4.

This pressure distribution can be algebraically calculated in a simple case as shown in FIG. 22. A force due to the gas pressure also can be calculated using the above-described expression (13). However, when there are a number of the high-pressure reaction gas supply inlets 2 as in the electrode H1, such a pressure distribution cannot be calculated algebraically. Numerical analysis using a finite element method or the like is required for such calculation. A force applied to the electrode H1 due to the gas pressure needs to be calculated using numerical analysis.

The high-pressure reaction gas supply device R controls the kind of the reaction gas, temperature, pressure, flow amount, and mixture ratio of a high-pressure reaction gas, and supples the high-pressure reaction gas. The high-pressure reaction gas is then supplied via the high-pressure reaction gas supply path 1 to the inside of the electrode f loating type high-pressure floating electrode H1. The high-pressure reaction gas supplied into the inside of the electrode floating type high-pressure floating electrode H1 is then supplied via the high-pressure reaction gas supply inlet 2 into the gap between the high-pressure floating electrode H1 and the sample J. The high-pressure reaction gas supply inlet 2 is provided on the high-pressure floating electrode H1 and at a position opposed to the sample J. The reaction container C is then evacuated by the gas discharging device E to a low pressure or vacuum. The electrode floating type high-pressure floating electrode H1 is floated with respect to the sample J by the micro gap D by a force due to a pressure difference from the atmosphere in the reaction container C.

Since the floating level, i.e., the micro gap D, is small, the conductance of the gas flow path from the high-pressure reaction gas supply inlet 2 to the low pressure or vacuum atmosphere in the reaction container C is very low. This provides a pressure distribution continuously changing from the reaction gas supply pressure P0 at the reaction gas supply inlet 2 to the pressure P1 of the low-pressure or vacuum atmosphere in the reaction container C in FIGS. 5A and 5B. At the same time, a low-pressure atmosphere having a pressure P2 (P2<P0) is provided at the reaction gas discharging outlet 4. The reaction gas discharging outlet 4 has an opening at the portion 12 (FIG. 3) of the electrode floating type high-pressure floating electrode H1 opposed to the sample J, and is connected via the reaction product discharging path 3 to the discharging device E so as to discharge the reaction gas and reaction product in the micro gap D. Similarly, this provides a pressure distribution changing from the reaction gas supply pressure P0 at the reaction gas supply inlet 2 to the low pressure P2 at the peripheral region of the reaction gas discharging outlet 4. Such a pressure distribution changing due to the micro gap D causes a pressure difference from the atmosphere in the reaction container C. The electrode H1 is floated due toabalance between such a pressure difference and the weight of the electrode H1.

The micro gap D is determined by the reaction gas supply pressure P0, the reaction container inside pressure P1, the weight of the electrode H1, the area where the electrode H1 and the sample J overlap one another, the outlet shape of the high-pressure reaction gas supply inlet 2, and the discharging rate at the reaction product discharging outlet 4 of the electrode H1 Accordingly, the gap between the electrode H1 and the sample J is measured using the device (not shown) for measuring the sample J and the electrode H1. The reaction gas supply pressure P0, temperature, and mixture ratio of the reaction gas, the ambient pressure, and the like are then controlled. The gap between the electrode H1 and the sample J is stably set to about 1 $\mu$m to about several hundreds $\mu$m over the large area where the electrode H1 and the sample J overlap one another.

In this case, the following alternative technique is in principle possible. The gap D between the electrode H1 and the sample J is measured using the device for measuring a gap between the sample J and the electrode H1, and is then held constant by controlling the stage S (FIG. 1). In fact, accurate measurement of the gap D is difficult because of: deformation of the electrode H1 and sample J due to plasma heat; an electric field for generating plasma; and corrosion of the atmosphere. Even in such situation, according to this invention, the electrode H1 is floated with respect to the sample 3 by utilizing the pressure difference between the pressure between the electrode H1 and the sample J and the pressure of the atmosphere in the reaction container C. The gap between the electrode Hi and the sample J is stably set to about 1 $\mu$m to about several hundreds $\mu$m over the large area where the electrode H1 and the sample J overlap one another.

Further, a magnetic member (not shown) or an arrangement (not shown) for generating a magnetic force may be optionally provided on the electrode H1 and the sample stage T. When the electrode H1 is floated by a magnetic force generated by the magnetic member or the arrangement, the pressure P0 at the high-pressure reaction gas supply inlet 2 can be set low and is determined depending on the target properties of a film, not on the weight of the electrode H1.

Next, (2) the method for generating the local high-pressure plasma P in the high-pressure reaction gas region will be described.

Figure 6:
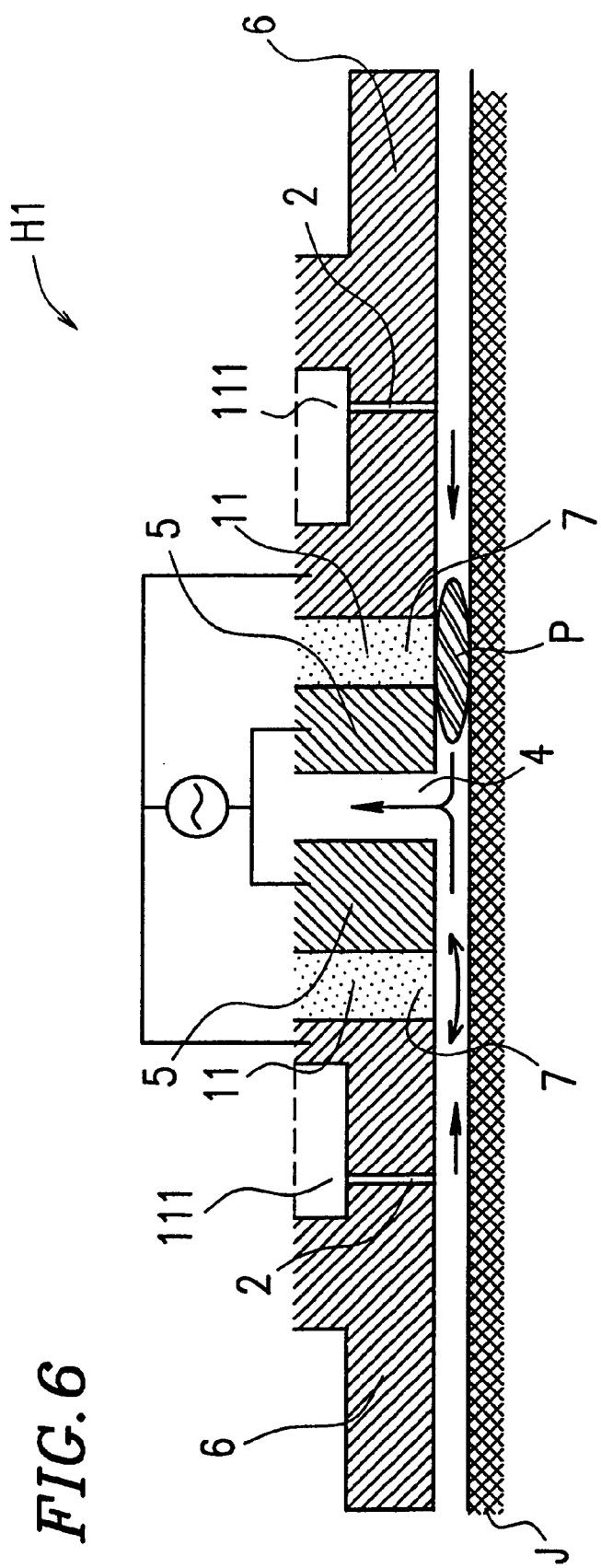
FIG. 6 is a diagram illustrating generation of local plasma P at a power transmission line open end provided at a portion opposed to the sample J of the electrode floating type high-pressure floating electrode H1.

FIG. 6 is a diagram illustrating generation of the local high-pressure plasma P at the power transmission line open end 7 provided at a portion opposed to the sample J of the electrode floating type high-pressure electrode H1.

Power generated by the power supply G in FIG. 1 is transmitted via the power transmission line K to the oscillation/matching device M. The power in optionally subjected to voltage boosting and impedance matching by the oscillation/matching device M. The resulting power is efficiently transmitted to the high-pressure floating electrode H1. The power voltage-boosted by the oscillation/matching device M is transmitted via the flexible power transmission line I to the electrode floating type high-pressure floating electrode H1. The power is further transmitted vla the power transmission line in the electrode H1 including the inner and outer electrodes 5 and 6 and the insulator 11 to the power transmission line open end 7. The power transmission line open end 7 is positioned at the portion opposed to the sample J of the high-pressure floating electrode H1 and is positioned away from the high-pressure reaction gas supply inlet 2.

The power transmission line open end 7, in Example 1 shown in FIG. 2, is a terminal portion of the overall line for transmitting direct or alternating current from the power supply G, the power transmission line K, the flexible power transmission line I, and the power transmission line in the electrode H1. In the terminal portion, the inner electrode 5 and the outer electrode 6 are insulated from each other by the insulator 11 at the portion 12 (FIG. 3) opposed to the sample J of the high-pressure floating electrode H1. With the power transmission line open end 7, as shown in FIG. 6, a high voltage or a strong electric field is generated between the inner and outer electrodes 5 and 6 to generate the plasma P between the inner and outer electrodes 5 and 6 regardless of the presence or absence of the sample J. It is further possible to prevent the plasma P from expanding beyond between the inner and outer electrodes 5 and 6, thereby generating the local high-pressure plasma P.

The power transmission line openend 7 is provided at the portion 12 (FIG. 3) opposed to the sample J of the high-pressure floating electrode H1. For this reason, the local high-pressure plasma P is generated in the high-pressure reaction gas region between the high-pressure floating electrode H1 and the sample J. The high-pressure reaction gas is decomposed in the local high-pressure plasma P to generate active seeds based on the reaction gas. The active seeds form a film on a surface of the sample J. The active seeds have a very high level of density according to the high-pressure reaction gas, thereby making it possible to form a film at a high rate.

In Example 1, the inner and outer electrodes 5 and 6 are a cathode and anode electrodes, respectively. The plasma P can be generated between the inner and outer electrodes 5 and 6 regardless of the presence or absence of the sample J. The equivalent circuit of the power transmission line K is not varied in the electrode scanning and the plasma P is therefore stable, so that a uniform film thickness distribution can be obtained. The stable plasma P is not limited to the case when the inner and outer electrodes 5 and 6 are a cathode and anode electrodes, respectively. The stability of the plasma P is ascribable to a high electric field being generated at the power transmission line open end 7 to generate the plasma P regardless of the presence or absence of the sample J.

A power absorber (not shown), which has a large absorption coefficient with respect to electromagnetic wave having the same frequency as that of the power supply G, may be provided on either the electrode H1 or the sample stage T. Specifically, the power absorber is disposed in the low conductance flow path from the reaction gas supply inlet 2 to the ambient atmosphere, more particularly in a portion of the flow path having a pressure lower than the region where the local high-pressure plasma P is generated. This power absorber can absorb an electromagnetic wave which is not consumed in the local high-pressure plasma P and passes through the plasma P. This prevents plasma from occurring in the ambient atmosphere, particularly when the reaction container C is under vacuum. Further, with the power absorber, the equivalent circuit of the power transmission line K is not varied in the electrode scanning and the plasma P is therefore stable, so that a uniform film thickness distribution can be obtained.

Next, (3) the method for obtaining a high-quality film and a clean surface of a film by performing film formation on the sample J at a high rate using the apparatus of Example 1 will be described.

In Example 1, the high-density active seeds based on the high-pressure reaction gas is generated by the local high-pressure plasma P in the high-pressure reaction gas region, thereby forming a film on the sample J at a high rate. At the same time, the pressure in the reaction container C is held at a pressure lower than the local high-pressure plasma generating portion or under vacuum, thereby obtaining a high-quality film or a clean surface of a film. The gas type, temperature, and pressure of the reaction gas should be selected depending on a target film material. The type of reaction gas is not limited to one type, but may be mixed with rare gas or other reaction gas to obtain an optimal condition.

The high-pressure reaction gas supplied from the. high-pressure reaction gas supply inlet 2 is moved according to the continuously changing pressure distribution as shown in FIG. 5B from the high-pressure P0 of the high-pressure reaction gas supply inlet 2 to the pressure P1 in the reaction container C evacuated to a low pressure or vacuum or the pressure P2 at the reaction gas discharging outlet 4, as shown in FIG. 5A. The high-pressure reaction gas is decomposed and exited by the local high-pressure plasma P generated at the power transmission line open end 7 provided at the portion 12 opposed to the sample J of the high-pressure floating electrode H1. The active seeds based on the reaction gas is then generated, which forms a film immediately under the local high-pressure plasma P.

Reaction caused by the local high-pressure plasma P generates not only the active seeds contributing to film formation but also molecules and atoms which do not contribute to the film formation. The molecules or atoms are also attached or polymerized with each other or with carbide or metal powder. The resultant reaction products do not contribute to the film formation. The carbide or metal powder are originated from the supplied gas and the material of the component such as the electrodes and the reaction container. These are referred to as impurities. The above-described reaction products also reach a surface of the sample J. When the film formation proceeds with those reaction products being attached onto the surface of the sample J, the reaction products are taken up in a film, thereby degrading film quality.

In the plasma P, condensed reaction products having a small grain diameter are quickly decomposed, and do not contaminate the film formed on the substrate surface as the reaction product. Reaction products released outside the plasma P are not decomposed, and are easily condensed with each other or impurities in the reaction container C. The grain diameters of the reaction products are then increased, and the number of the reaction products having a large grain diameter also is increased. There is a problem in the reaction products having a large grain diameter as generated above. The reaction products having a large grain diameter are not quickly decomposed when being diffused into the plasma P again, and then reach the sample J while keeping a given grain diameter. The large reaction products contaminate the film formed on the sample J, resulting in a significant reduction in film quality. The reaction products having a large grain diameter are also attached to the inner walls of the reaction container C and contaminate the inside of the reaction container C. This leads to contamination of the film surface after the film formation, resulting in a decrease in process yield.

There is a problem in that the outside of the plasma P has substantially the same pressure as that in the plasma P. The reaction products released outside the plasma P are suspended in the reaction container C for a long time. The high-pressure atmosphere causes the reaction products to have a short mean free path. During the suspension, therefore, the reaction products collide and are condensed with each other or impurities in the reaction container C repeatedly in a number of times. The grain diameters of the reaction products and the number of the reaction products having a large grain diameter are thus increased. As described above, when such reaction products are diffused into the plasma P again, the reaction products are not quickly decomposed and reach the surface of the sample J to contaminate a film. Thus, the quality of the film is significantly reduced.

On the other hand, in Example 1, the high-pressure floating electrode H1 is opposed to the sample J. The gas flow path from the high-pressure reaction gas supply inlet 2 to the atmosphere in the reaction container C has a low conductance. For this reason, the gas flow path between the sample J and the electrode H1 becomes a reaction gas region having a pressure higher than the pressure of the atmosphere in the reaction container C. The plasma P is generated in such a reaction gas region, thereby achieving a high film formation rate. Meanwhile, the pressure of the atmosphere in thereaction container C has a pressure lower than that in the plasma P, so that the mean free path is increased. The reaction products do not collide and are not condensed with each other, so that the grain diameters of the reaction products are not grown. The reaction products having a smaller diameter are quickly decomposed when being diffused into the plasma P. and thus do not contaminate the film formed on the surface. As a result, high film quality and a clean surface of a film can be obtained.

The lower the pressure of the atmosphere in the reaction container C, the higher the film quality and the cleaner the film surface. The lower limit of the pressure is vacuum.

It will now be discussed that the reaction products generated in the local high-pressure plasma P are transported or eliminated by a flow along a surface of the sample J in the micro gap D between the high-pressure floating electrode H1 and the sample J. The reaction products based on the high-pressure reaction gas in the local high-pressure plasma P are quickly moved by a flow along the surface of the sample J, and are then discharged through the reaction gas discharging outlet 4 provided in the high-pressure floating electrode H1 to the reaction gas discharging device E without stagnating in a given region. The atmosphere over the film surface or in the reaction container C is thus cleaned. The reaction products are discharged into the vacuum or low pressure atmosphere surrounding the high-pressure floating electrode H1 without stagnation. The reaction container C is constantly evacuated to vacuum or a given pressure or less, so that the discharged reaction products are prevented from being condensed with atmospheric particles or attached to the film surface. The inside of the reaction container C and the film surface are thus cleaned.

The gas discharged from the reaction container C may be reprocessed and supplied again into the reaction container C as the ambient atmosphere, or into the gap D as the reaction gas.

Further, it will be described that the power transmission line open end 7 is provided away from the high-pressure reaction gas supply inlet 2 to prevent formation of the film formation amount distribution immediately under the high-pressure reaction gas supply inlet 2.

FIG. 7A is a cross-sectional view illustrating the vicinity of the high-pressure reaction gas supply inlet 2. FIG. 7B is a cross-sectional view illustrating a film thickness distribution formed immediately under the high-pressure reaction gas supply inlet 2 when the local high-pressure plasma P is generated in the vicinity including the supply inlet 2 using the structure shown in FIG. 7A. FIG. 7C is a diagram illustrating a state of a gas flow generated in the micro gap D in the situation shown in FIGS. 7A and 7B. FIG. 8A is a cross-sectional view illustrating the vicinity of the high-pressure reaction gas supply inlet 2 and the power transmission line open end 7 when the line open end 7 is provided at a position away from the high-pressure reaction gas supply inlet 2. FIG. 8B is a cross-sectional view illustrating a film thickness distribution formed immediately under the local high-pressure plasma P when the local high-pressure plasma P is generated in the vicinity including the supply inlet 2 using the structure shown in FIG. 8A. FIG. 8C is a diagram illustrating a state of a gas flow generated in the micro gap D in the situation shown in FIGS. 8A and 8B. In FIGS. 7B and 8B, a film thickness distribution 1711 is formed immediately under the high-pressure reaction gas supply inlet 2 when the local high-pressure plasma P is generated in the vicinity including the supply inlet 2, and a film thickness distribution 1712 is formed immediately under the local high-pressure plasma P when the local high-pressure plasma P is generated when the line open end 7 is provided at a position away from the high-pressure reaction gas supply inlet 2, respectively. In FIGS. 7A and 8A, a high-pressure reaction gas blowoff flow 1611 is blown off from the high-pressure reaction gas supply inlet 2, and a high-pressure reaction gas flow 1612 flows along the sample surface in the micro gap D, respectively. In FIGS. 7C and 8C, a turbulent flow having a flow rate distribution 1613 of the reaction gas occurs in the vicinity of the supply inlet 2, a shear flow having a flow rates distribution 1614 of the reaction gas occurs away from the supply inlet 2, and a shear flow having a flow rate distribution 1615 of the reaction gas occurs sufficiently away from the supply inlet 2.

As to the flow rate distribution of the high-pressure reaction gas in the micro gap D between the high-pressure floating electrode H1 and the sample J, the turbulent flow 1613 occurs immediately under the high-pressure reaction gas supply inlet 2 and in the vicinity thereof. The high-pressure reaction gas is a non-steady flow which varies over time, having a turbulent flow rate distribution. In this case, there is a flow rate distribution not only along the sample surface but also in a direction perpendicular to the sample surface. Further away from the supply inlet 2, the flow rate distribution gradually becomes stable as is represented by the flow rate distribution 1614 where there is a flow rate distribution only along the sample surface. Eventually, the flow becomes a steady shear flow where there is a flow rate distribution only along the sample surface as is represented by the flow rate distribution 1615. This depends on parameters such as the micro gap D and the flow rate of the reaction gas. The steady shear flow has the flow rate distribution 1615 (U) which is represented by the following expression.

$$U = \frac{\Delta U_{max}}{D^2}\left(\frac{D^2}{4} - x^2\right)$$ Expression (18)

In expression (18), the coordinate origin is positioned at the center of the micro gap D; the x axis is in a direction perpendicular to the sample surface: U is a flow rate distribution in a direction along the sample surface at a position a distance x from the origin; is the maximum flow rate at the center of the micro gap D; and x is a distance from the origin.

When plasma is generated across the portion 12 opposed to the sample J of the high-pressure floating electrode H1 including a portion immediately under the high-pressure reaction gas supply inlet 2, a film is formed on a region of the sample J corresponding to the entire plasma generated region 12. In this oase, as shown in FIG. 7A, the blowoff high-pressure reaction gas flow 1611 immediately under the high-pressure reaction gas supply inlet 2 collides with the sample surface in a direction perpendicular to the sample surface. This leads to generation of an unstable turbulent flow changing a flow rate distribution over time. A film formation amount is larger immediately under the reaction gas supply inlet 2 compared with in a region where there is the flow 1612 (flow distribution 1615) along the sample surface outside there action gas supply inlet 2. For this reason, a film formation amount distribution 1711 as shown in FIG. 7B is provided. When a film is formed on the entire sample surface by scanning with the high-pressure floating electrode H1, a film thickness distribution, which is determined by the position of the high-pressure reaction gas supply inlet 2 and the scanning course of the electrode H1, is formed on the film surface after the film formation.

In Example 1, as shown in FIG. 8A, plasma is generated by the power transmission line open end 7 including the inner and outer electrodes 5 and 6. This allows regulation of a region where the plasma is generated. The local high-pressure plasma P is obtained. The local high-pressure plasma P is positioned substantially away from the high-pressure reaction gas supply inlet 2, where the stable shear flow 1615 is generated. This leads to prevention of formation of the film formation amount distribution 1711 immediately under the high-pressure reaction gas supply inlet 2. The film formation is performed by a flow along the sample surface in the micro gap D in the region where the local high-pressure plasma P is generated. The above-described film thickness distribution 1712 immediately under the local plasma P which is very stable is obtained. By scanning the entire sample with such a film formation region, a film which has a uniform film formation amount distribution can be obtained.

In the surface treatment of this invention, the local high-pressure plasma P is generated. The local film formation is performed in the vicinity of the plasma P. The electrode H1 and the sample J are relatively moved in such a way as to perform the film formation across the entire sample surface. The micro gap D is obtained by a balance among the high pressure of the reaction gas between the electrode H1 and the sample J: the weight of the electrode H1; and a low pressure or vacuum atmosphere in the reaction container C. To this end, the power transmission line connecting between the oscillation/matching device M and the electrode floating type high-pressure floating electrode H1 is preferably the flexible power transmission line I which is transformable. The connector 8 connects between the flexible power transmission line I and the high-pressure floating electrode H1.

This connection can be done without a loss due to contact resistance at the connection portion and without a leak of electromagnetic wave.

The insulator 11 is preferably made of a material which is not corroded by the local high-pressure plasma P generated at the power transmission line open end 7, such as high-purity almina and silicon nitride. The insulator 11 preferably includes at least an element included in a film material. For example, when a Si film is formed, the use of silicon nitride (SiN) for the insulator 11 leads to a reduction of impurity contamination into a film.

As to the sample fixing portion F (FIG. 2), a jig for fixing the sample J may protrude as is opposed to the high-pressure floating electrode H1. In this case, since the high-pressure floating electrode H1 and the sample J are very close to each other as described above, the jig contacts and damages the portion 12 opposed to the sample J of the high-pressure floating electrode H1, or disturbs the pressure distribution in the micro gap D. These are problems. Therefore, the sample fixing portion F is preferably an arrangement in which a sample fixing jig does not protrude into a portion opposed to the electrode H1, such as vacuum chuck or electrostatic chuck.

The step t between the sample J and the sample stage T (FIG. 4) changes the pressure distribution of the high-pressure reaction gas in the micro gap D. For this reason, the electrode floating type high-pressure floating electrode H1 is tilted with respect to the sample J. This further causes problems such as variation in the film formation rate distribution, and contact of the sample J with the electrode H1. Therefore, the step t should be as small as possible.

A high-hardness insulator having corrosion resistance, such as a thermal spraying almina film, may be provided on the portion 12 (FIG. 3) opposed to the sample J of the high-pressure floating electrode H1. The insulator is also made flat with high accuracy. Such an insulator can reduce corrosion of the portion 12 due to plasma, thereby obtaining a high-pressure floating electrode having an extended life span.

Figure 9:
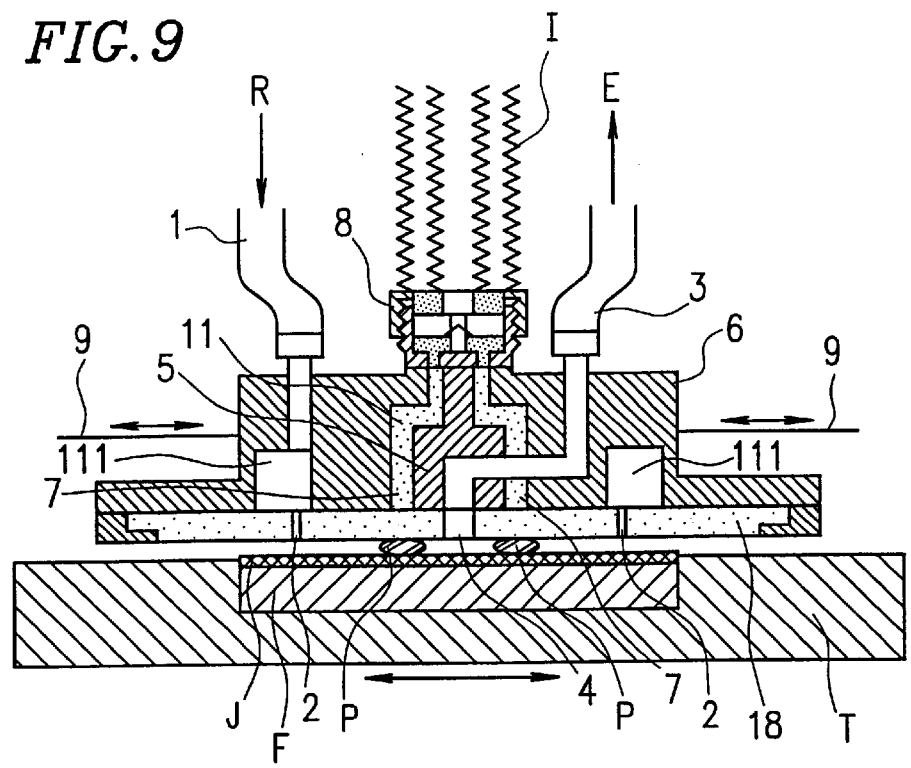
FIG. 9 is a cross-sectional view illustrating an electrode floating type high-pressure floating electrode having a highly accurately flattened insulator having corrosion resistance and high hardness in its portion opposed to a sample.

As shown in FIG. 9, an insulator 18 having high-accurate flatness, corrosion resistance and high hardness, such as an insulator made of high-purity almina or silicon nitride, may be attached to the entire portion 12 (FIG. 3). The insulator 18 may be made of a material having corrosion resistance and high hardness as well as a property which inhibits film formation.

Figure 10:
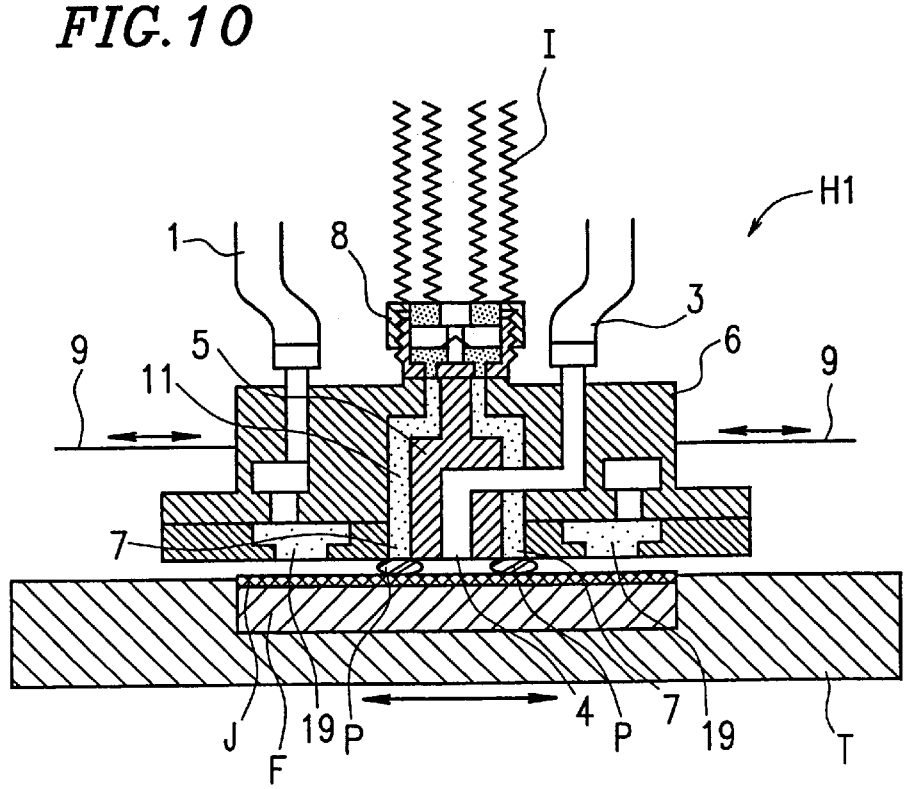
FIG. 10 is a cross-sectional view illustrating an electrode floating type high-pressure floating electrode having a high-pressure reaction gas supply inlet made of a porous material.

Alternatively, as shown in FIG. 10, the reaction gas supply inlet 2 may be made of a porous material 19, such as porous almina. This makes it possible to obtain the high-pressure floating electrode H1 in which the narrow gap D between the electrode H1 and the sample J can be controlled so that it is very stable.

Figure 11:
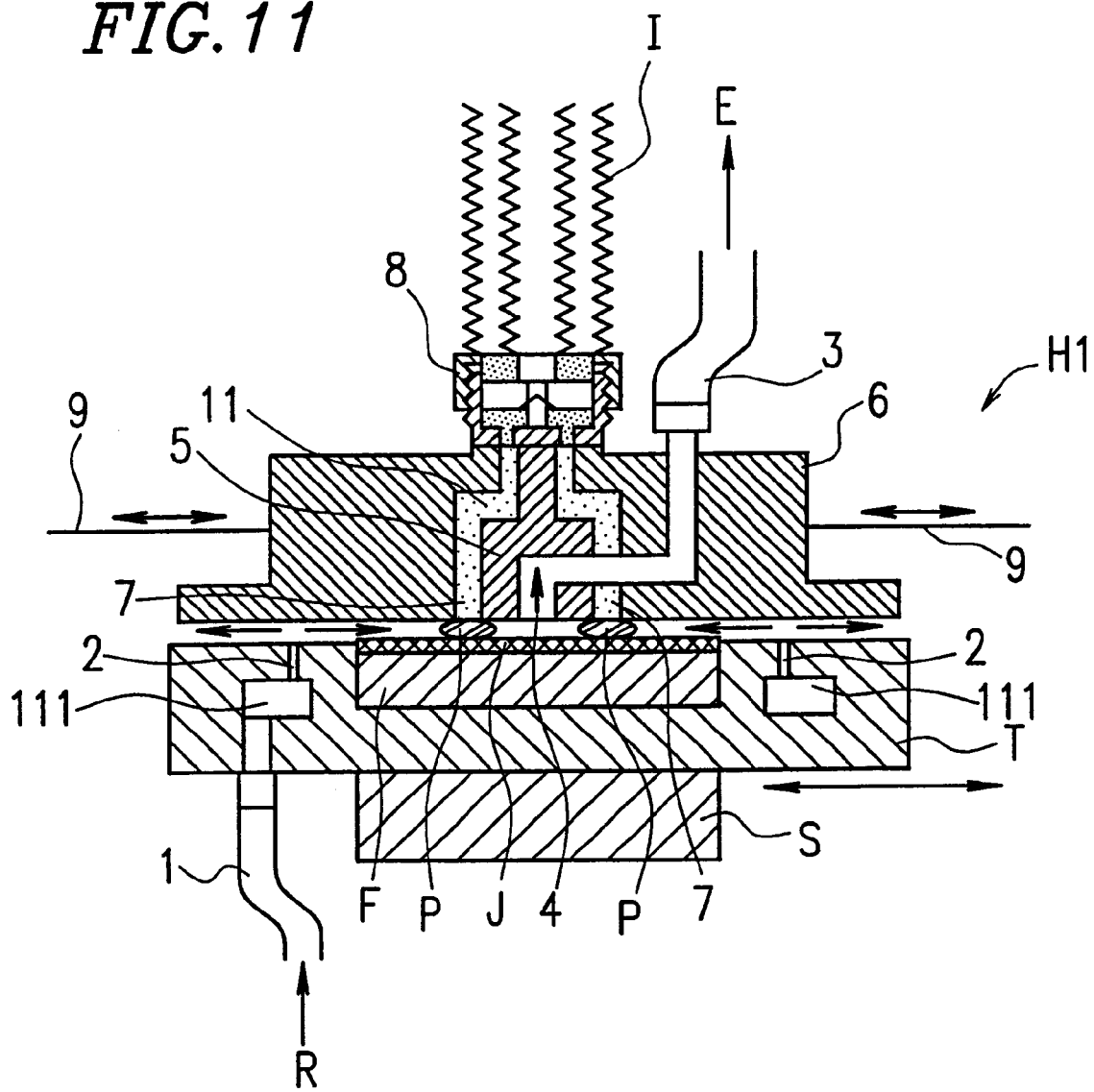
FIG. 11 is a cross-sectional view illustrating an electrode floating type high-pressure floating electrode and a sample stage T when a high-pressure reaction gas inlet is provided in the sample stage T.

In the high-pressure floating electrode H1, the position and quantity of the high-pressure reaction gas supply inlet 2 and reaction gas discharging output 4 are not limited to one. For example, as shown in FIG. 11, the high-pressure reaction gas supply inlet 2 may be provided in the sample stage T. Further, the high-pressure reaction gas supply inlet 2 and the reaction gas discharging output 4 may be provided in the sample stage T, or both in the high-pressure floating electrode H1 and the sample stage T.

The scanning stage S described with reference to FIG. 1 may include a vertical motion arrangement, a horizontal motion arrangement, a rotation arrangement, or the like, depending on the purposes The number of the samples J fixed on the sample stage T is not limited to one. A batch processing may be adopted using a sample stage which can fix a number of samples, thereby increasing production efficiency.

Figure 12:
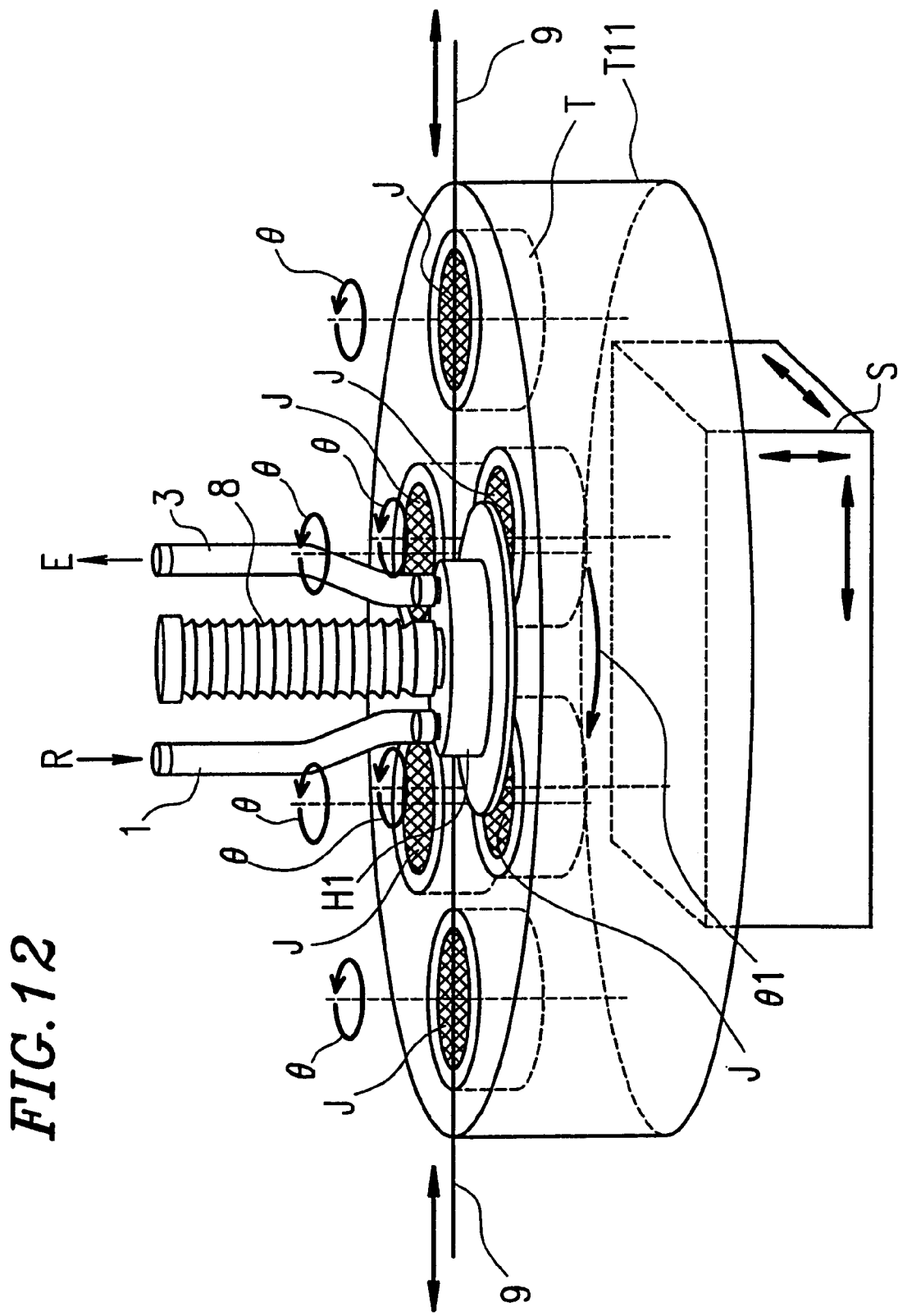
FIG. 12 is a conceptual diagram illustrating a batch processing using a multi-sample fixing sample stage T11 having multiple rotational axes and rotation frequency.

FIG. 12 is, for example, a conceptual diagram illustrating a batch processing using a multi-sample fixing sample stage T11 having a number of sample stages T having the respective rotational axes and rotation frequency.

In the example structure of FIG. 12, the sample stage T11 having a rotation arrangement θ1 is provided on the scanning stage which can scan in multiple directions X, Y, and Z. A number of sample stages T are provided in the multi-sample stage T1. Each sample stage T includes a rotation arrangement θ having a rotation frequency, a rotation direction, and a rotation axis which are the same as or different from those of the rotation arrangement θ1 of the multi-sample stage T11. The sample J is placed on each Bample stage T. The batch processing is performed by the electrode floating type high-pressure floating electrode H1 opposed to the sample J. The electrode H1 is moved by a scanning wire or belt 9 to scan. Random scanning is performed using the multi-direction scanning of the scanning stage S or the rotation arrangements of the sample stages T and T11. This leads to formation of a film having excellent uniformity on each sample J. The batch processing also allows an increase in production efficiency.

The shapes of the high-pressure reaction gas supply inlet 2, the reaction product discharging outlet 4, and the portion 12 opposed a sample of the high-pressure floating electrode H1 are changed depending on the target shape, size, and finishingaccuracy of the sample J. The high-pressure floating electrode H1 is not limited to the above-described high-pressure floating electrodes H1 of Example 1 having the high-pressure reaction gas supply inlet 2, the reaction product discharging outlet 4, and the portion 12.

A high-pressure portion for positioning the sample J or the like in a horizontal direction may be provided in the reaction container C. This high-pressure portion is not included in the above-described ambient atmosphere having a pressure lower than the supply pressure.

EXAMPLE 2

Next, Example 2 of this invention using a sample floating type high-pressure floating electrode H2 will be described.

The sample floating type high-pressure floating electrode H2 can generate local high-pressure plasma P using power transmitted from a power supply G. A sample A is floated with respect to the sample floating type high-pressure floating electrode H2 of Example 2. The sample floating type high-pressure floating electrode H2 and the floating sample A are provided in a reaction container C.

Figure 13:
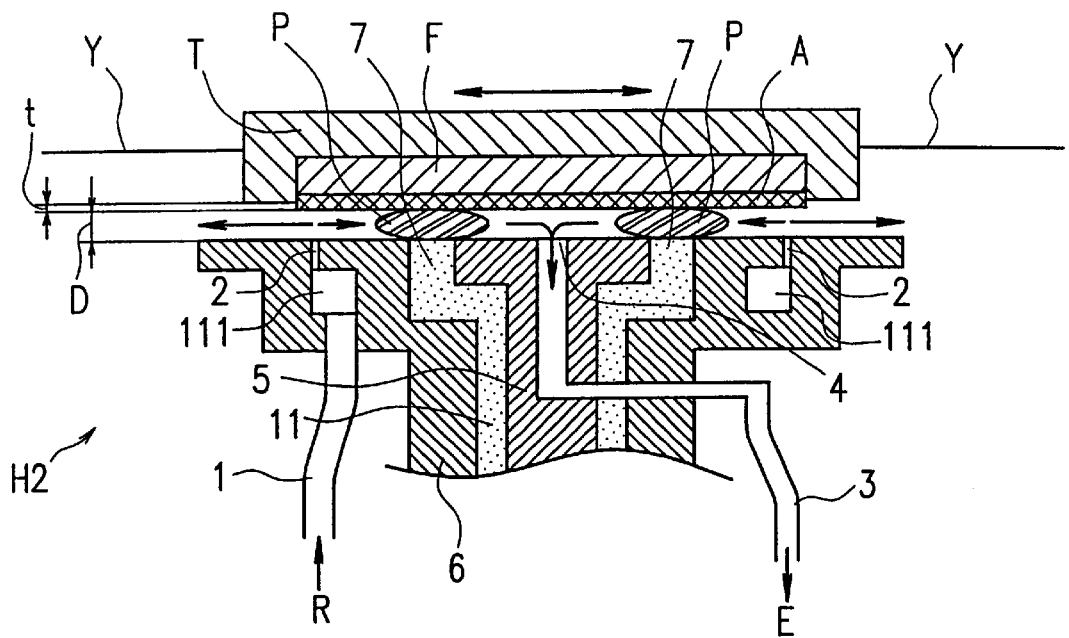
FIG. 13 is a cross-sectional view illustrating a sample floating type high-pressure floating electrode H2.

FIG. 13 is a cross-sectional view illustrating the sample floating type high-pressure floating electrode H2. Reference numeral Y indicates a floating sample scanning wire or belt. The sample floating type high-pressure floating electrode H2 is provided on a scanning stage S (not shown in FIG. 13). The sample floating type high-pressure floating electrode H2 is moved by the scanning stage S for scanning, changing a positional relationship between the sample floating type high-pressure floating electrode H2 and the floating sample A.

The floating sample scanning wire or belt Y is connected to a driving motor 10 which is not shown in FIG. 13. Similar to the electrode floating type high-pressure floating electrode H1 of Example 1, the floating sample A is moved for scanning by rotating the driving motor 10. Thus, the positional relationship between the sample floating type high-pressure floating electrode H2 and the floating sample A can be changed. A combination of the driving motor 10 and the floating sample scanning wire or belt Y is referred to as a sample stage scanning device.

As described above, in Example 2, the sample A is floated by a small gap D with respect to the sample floating type high-pressure floating electrode H2 for generating the local high-pressure plasma P. Similar to the electrode floating type high-pressure floating electrode H1 of Example 1, the local high-pressure plasma P is generated in the micro gap D to produce active seeds based on the high-pressure reaction gas. A film is locally formed on the floating sample A in the vicinity of the local high-pressure plasma P. The positional relationship between the sample floating type high-pressure floating electrode H2 and the floating sample A can be changed using the scanning stage S and the sample stage scanning device, thereby performing film formation on the entire surface of the sample A. Similar to Example 1, a high-pressure reaction gas supply inlet 2, a reaction product discharging outlet 4, and a power transmission line open end 7 are provided in Example 2, each of which has a shape and a position or a structure similar to that of Example 1. In particular, in Example 2, the sample A as well as the sample stage T can be floated by a relatively low supply pressure where the sample A is made of a light weight material such as glass substrate. This allows a wide range of pressure condition in the processing. In addition, the sample A can be relatively easily transported, thereby improving the productivity of the overall apparatus.

Example 2 has a configuration of the overall apparatus partially shown in FIG. 13; a principle and method for floating the floating sample A; a principle and method for generating the local high-pressure plasma P; a principle and method for simultaneously achieving a film formation phenomenon in the local high-pressure plasma P, a high film formation rate, an improvement in film quality, and a clean surface of a film after film formation; and a principle and method for preventing formation of the film formation amount distribution 1711 immediately under the high-pressure reaction gas supply inlet 2 by generating the local high-pressure plasma P away from the high-pressure reaction gas supply inlet 2, which are similar to those in Example 1.

The following features described in Example 1 can also be applied to Example 2: the shape of the high-pressure floating electrode H1; the formation of the corrosion-resistant and high-hardness insulator with respect to the portion 12 opposed to the sample J of the electrode floating type high-pressure floating electrode H1; the insulator 18 having high-accurate flatness, corrosion resistance and high hardness is provided with respect to the portion 12 opposed to the sample J of the electrode floating type high-pressure floating electrode H1 as shown in FIG. 9; the porous material is provided with respect to the high-pressure reaction gas supply inlet 2 as shown in FIG. 10; a batch processing using the multi-sample fixing sample stage T having multiple rotational axes and rotation frequency shown in FIG. 12; and a configuration of the sample stage T, the sample fixing portion F, or the like.

Figure 14:
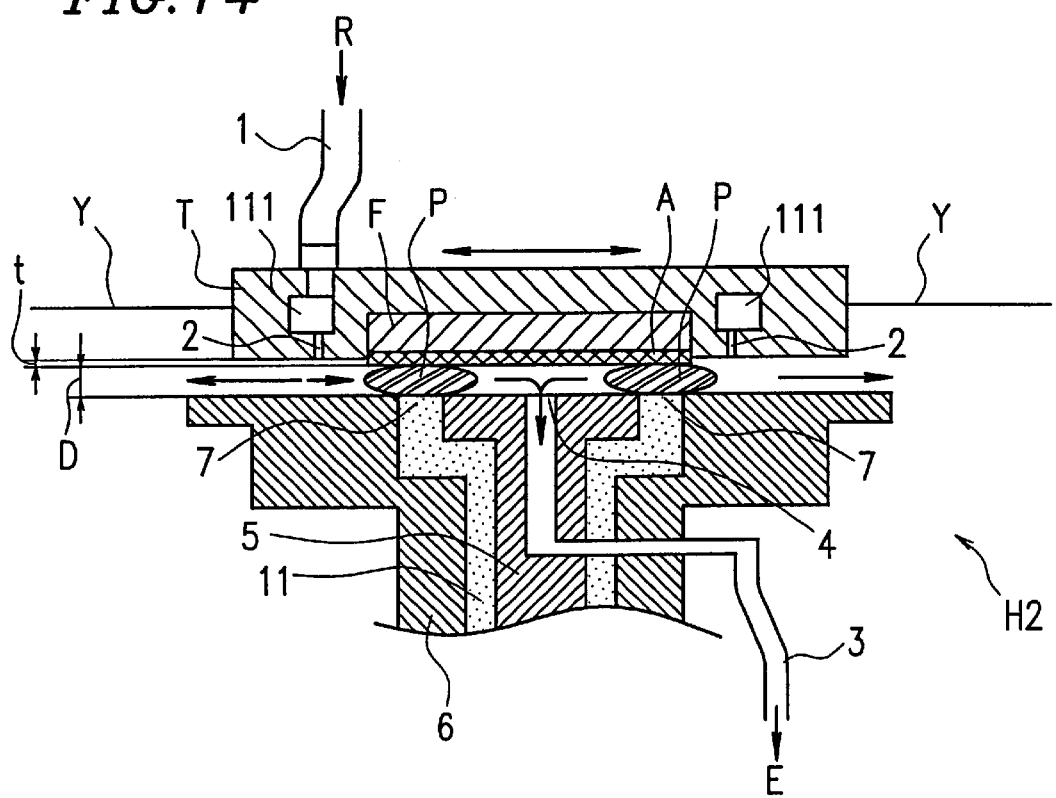
FIG. 14 is a cross-sectional view illustrating a sample floating type high-pressure floating electrode H2 and a sample stage T when a high-pressure reaction gas inlet is provided in the sample stage T.

For the sample floating type high-pressure floating electrode H2, as shown in FIG. 14, the position and quantity of the high-pressure reaction gas supply inlet 2 and reaction product discharging outlet 4 are not limited to one. The high-pressure reaction gas supply inlet 2 and the reaction product discharging outlet 4 may be provided in the sample stage T or the high-pressure floating electrode H2, or both thereof.

Figure 15:
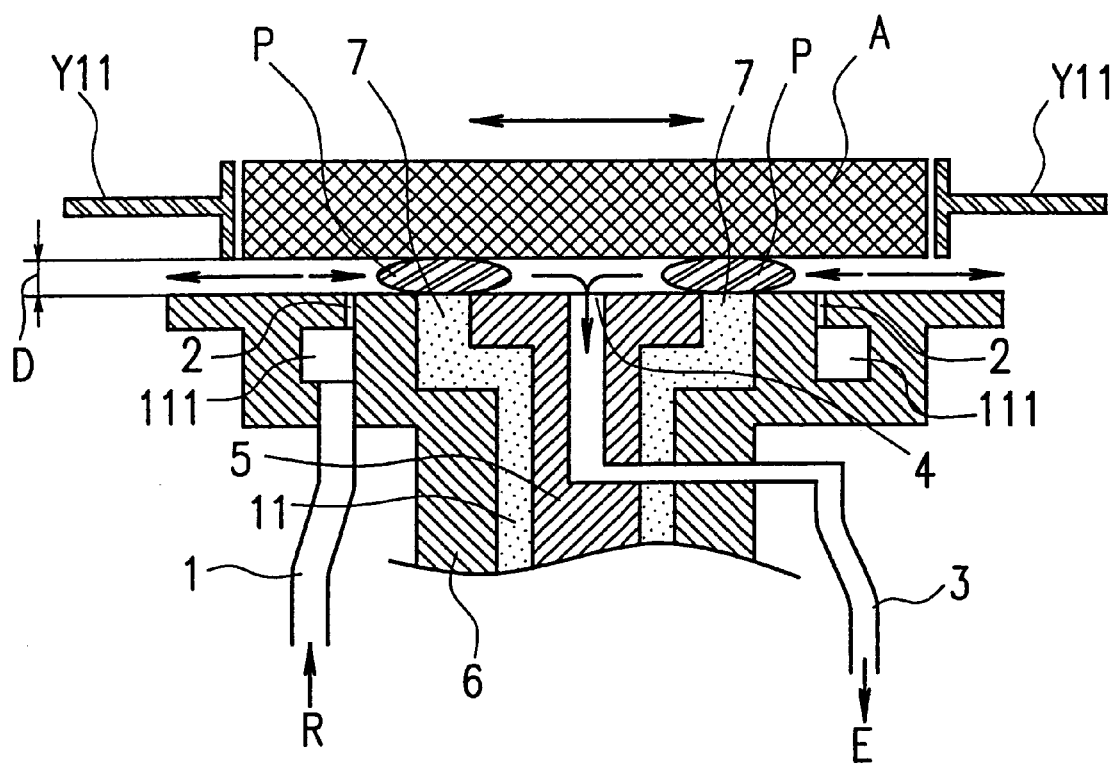
FIG. 15 is a cross-sectional view illustrating a sample floating type high-pressure floating electrode H2 when only a sample is floated.

FIG. 15 shows a structure in which a floating member with respect to the sample floating type high-pressure floating electrode H2 is only the floating sample A, riot the sample stage T (FIG. 13) on which the floating sample A is fixed.

In FIG. 15, a floating sample restraint scanning arrangement Y11 is provided for restraining the floating sample A or moving it for scanning. In the floating sample restraint scanning arrangement Y11, the above-described scanning wire or belt Y is not directly connected to the floating sample A. The floating sample A is pushed from a lateral side thereof, not in a floating direction of the floating sample A, to be moved for scanning.

According to the floating sample restraint scanning arrangement Y11, a time required to chuck the sample A can be omitted. The floating sample A may be moved in a single direction by the floating sample restraint scanning arrangement Y11. Film formation is thus performed in an assembly-line way. Thereafter, all the samples A are transferred together. This leads to an increase in process productivity.

EXAMPLE 3

Next, Example 3 of this invention using an electrode floating type high-pressure floating electrode H3 in which the power transmission line includes a waveguide will be described.

When the waveguide is used for the power transmission line, such a power transmission line cannot transmit direct current and low-frequency alternating current. Therefore, as the power supply G, a microwave power supply G11 having a radio frequency of about 10 MHz to about 1 GHz, or about 1 GHz or greater is used.

Figure 16:
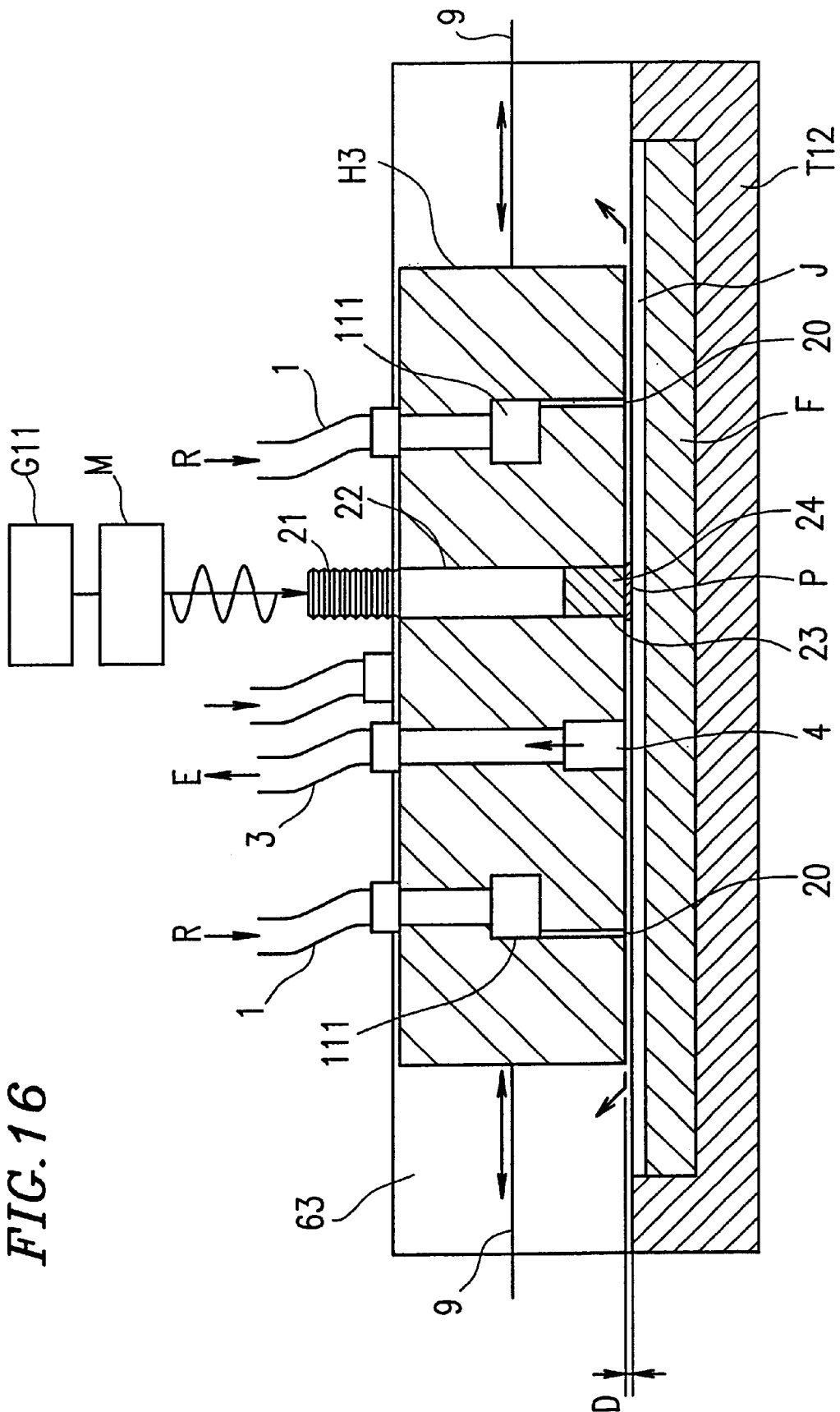
FIG. 16 is a cross-sectional view illustrating an electrode floating type high-pressure floating electrode H3 in which a power transmission line includes a waveguide.
Figure 17:
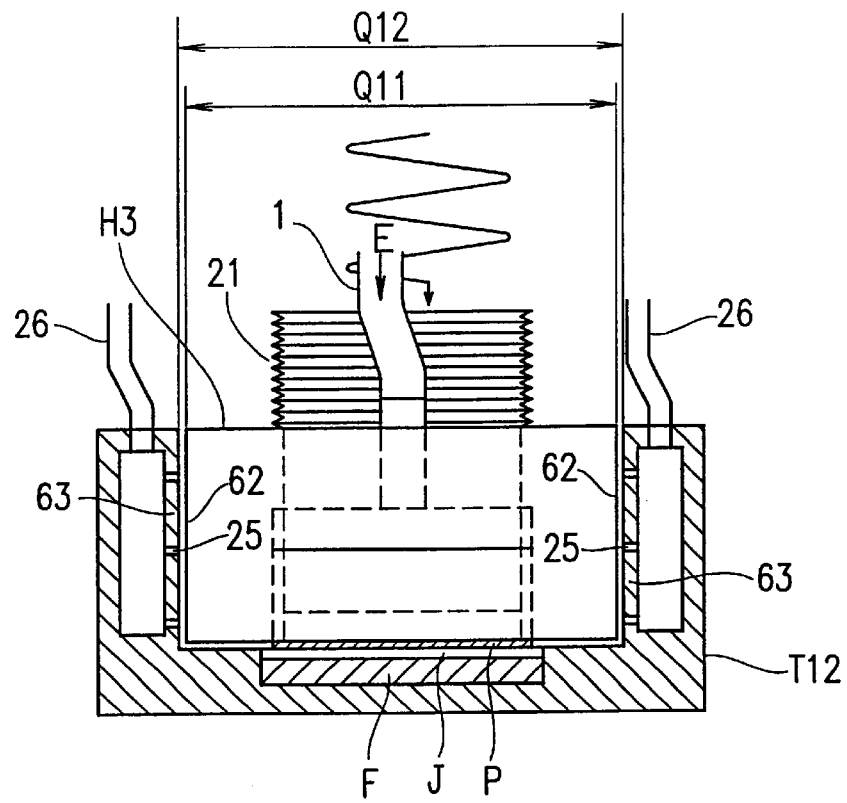
FIG. 17 is another cross-sectional view illustrating the electrode floating type high-pressure floating electrode H3 in which a power transmission line includes a waveguide.
Figure 18A:
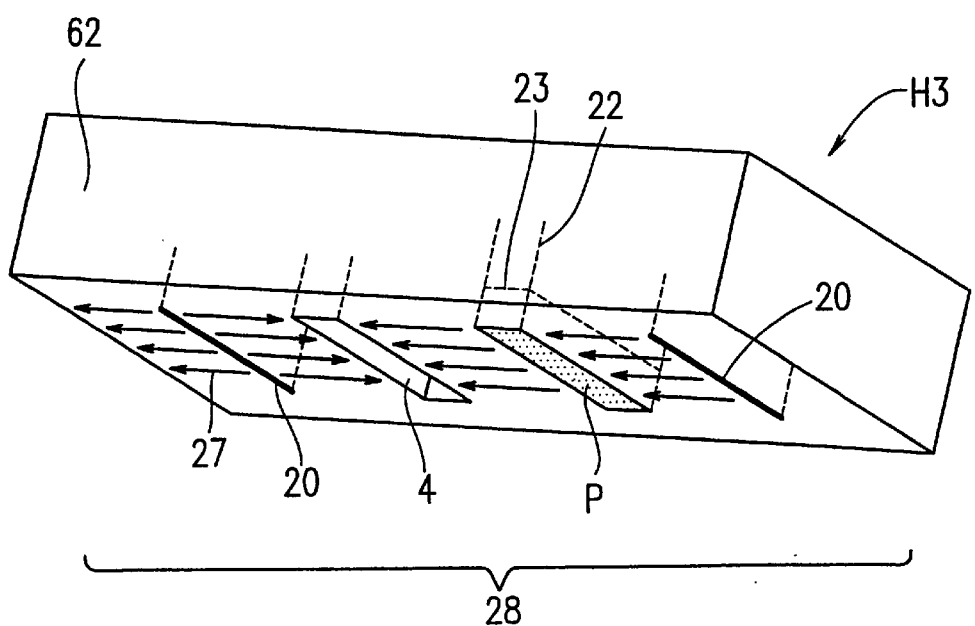
FIG. 18A is a diagram illustrating the electrode floating type high-pressure floating electrode H3, in which a power transmission line includes a waveguide, viewed obliquely from below.
Figure 18B:
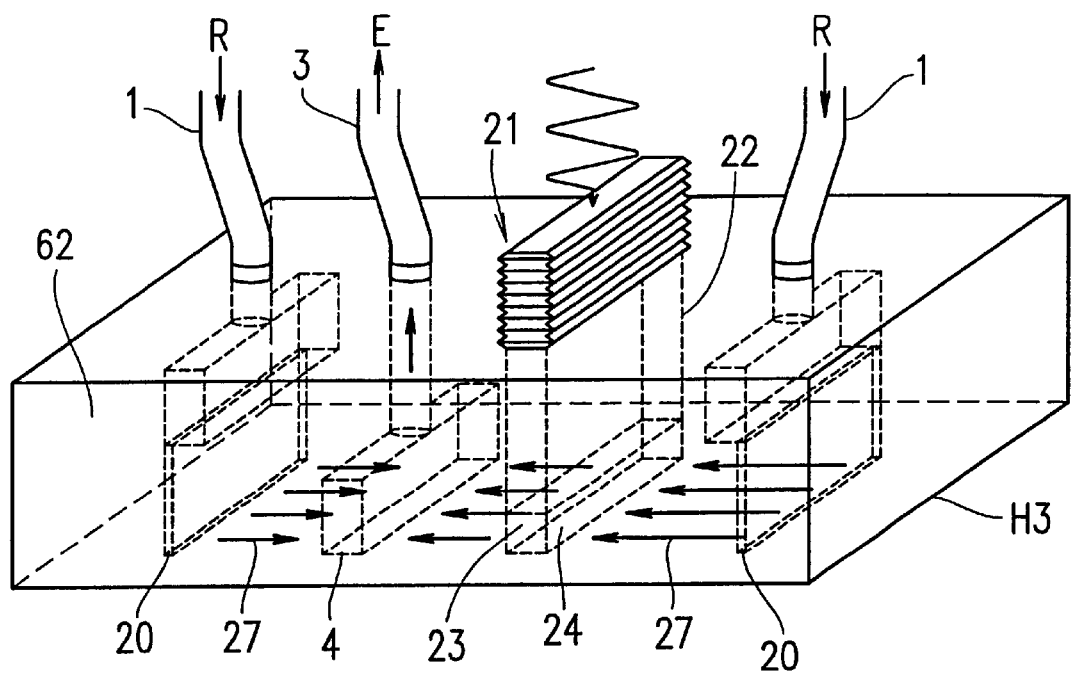
FIG. 18B is a diagram illustrating the electrodo floating type high-pressure floating electrode H3, in which a power transmission line includes a waveguide, viewed obliquely from above.

FIG. 16 is a cross-sectional view illustrating the electrode floating type high-pressure floating electrode H3 in which the power transmission line includes the waveguide. FIG. 17 is a partial cross-sectional diagram of the electrode E3 viewed from another direction. FIGS. 18A and 18B are diagrams of the electrode H3 viewed obliquely from below and above, respectively.

In FIG. 16, reference numeral H3 indicates the electrode floating type high-pressure floating electrode in which the power transmission line includes the waveguide; P the local high-pressure plasma; Z4 an open end of the waveguide for generating the local high-pressure plasma P in a micro gap D between the electrode H3 and the sample J by an applied microwave generating a high electric field; 21 a flexible waveguide for transmitting a microwave from an oscillation/matching device M to the high-pressure floating electrode H3, where the oscillation/matching device M subjects the microwave supplied from the microwave power supply G11 to voltage-boosts and matching; 22 an intra-electrode waveguide for transmitting the microwave from the flexible waveguide 21 to the waveguide open end 24 positoined at a portion 28 (FIG. 18A) opposed to the sample J of the electrode H3; 23 an insulator for isolating a space inside the intra-electrode waveguide 22 from a high-pressure reaction gas region in the micro gap D between the electrode H3 and the sample J; and 20 a high-pressure reaction gas supply slit having the shape of a slit which functions as a high-pressure reaction gas supply inlet.

In FIG. 17, reference numeral T12 indicates a trough-shaped sample stage for fixing the sample J at the bottom side of the trough portion and for restraining movement of the electrode H3 by a side wall of the trough portion, 25 a high-pressure gas supply inlet provided in an inside side wall of the trough-shaped sample stage T12, which restricts the moving direction of the electrode H3 to a single direction using a high-pressure gas blown off from the supply inlet 25 without contacting with the electrode H3 and 26 a high-pressure gas supply path for transporting a high-pressure gas from a high-pressure gas supply device (not shown) to the high-pressure gas supply inlet 25.

In FIG. 18A, reference numeral 27 indicates a flow of the reaction gas along a surface of the sample J through the micro gap D between the electrode H3 and the sample J from the high-pressure reaction gas slit 20 to the reaction gas dlscharging outlet 4 or to an atmosphere surrounding the electrode H3.

In FIGS. 16, 17, 18A, and 18B, the sample J, the sample fixing portion F, the high-pressure reaction gas supply path 1, the reaction product discharging path 3, and the reaction product discharging outlet 4 each have a structure similar to that of Examples 1 and 2. The scanning stage S, the reaction container C, the power supply G, the power transmission line K, the oscillation/matching device M, the high-pressure reaction gas supply device R, the discharging device E, the high-pressure floating electrode scanning device U, and the control device R, which are not shown, each have a structure similar to that of Examples 1 and 2, except that the radio-frequency or microwave power supply G11 is used in place of the power supply G.

Hereinafter, a description will successively be given of the structure of the electrode floating type high-pressure floating electrode H3 in which the power transmission line includes the waveguide; a method for floating the high-pressure floating electrode H3; a method for film formation using the high-pressure floating electrode H3; effects of using the power transmission line including the waveguide; and effects of using the microwave power supply G11.

Initially, the electrode floating type high-pressure floating electrode H3 in which the power transmission line includes the waveguide will be described. As shown in FIGS. 18A and 18B, the electrode H3 is a metal cube, a side opposed to the sample J of which is highly accurately flattened. This side of the electrode H3 is referred to as a portion 28 opposed to the sample J of the electrode floating type high-pressure floating electrode H3. Further, the intra-electrode waveguide 22 which can transmit microwave power is provided inside the metal cube. The waveguide 22 has an open end at the desired position within the portion 28. A space inside the open-ended intra-electrode waveguide 22 is blocked by the insulator 23 to be isolated from the atmosphere surrounding the electrode floating type high-pressure floating electrode H3. The open end of the intra-electrode waveguide 22 is referred to as a waveguide open end 24. The flexible waveguide 21 is connected to the intra-electrode waveguide 22 at an end opposite to the open end 24. The microwave power generated by the power supply G11 is thus transmitted to the intra-electrode waveguide 22 and further to the waveguide open end 24. The microwave power causes generation of the local high-pressure plasma P at the waveguide open end 24.

The insulator 23 is preferably made of a material which has high hardness and is not corroded by the local high-pressure plasma P, such as high-purity almina and silicon nitride. The insulator 23 may include at least an element included in a film material. For example, when a Si film is formed, the preferable use of silicon nitride (SiN) for the insulator 23 leads to a reduction of impurity contamination into a film. After the insulator 23 is placed, the portion 28 is preferably subjected to a flattening process again so as to be highly accurately flat. The high-pressure reaction gas supply slit 20 having an opening for blowing off the high-pressure reaction gas is provided in the portion 28 and positioned away from the waveguide open end 24. The high-pressure reaction gas is supplied from the high-pressure reaction gas supply device R via the high-pressure reaction gas supply path 1 to the high-pressure reaction gas supply slit 20. The high-pressure reaction gas is blown off from the high-pressure reaction gas supply slit 20. Further, the reaction product discharging outlet 4 is provided in the portion 28. The reaction product discharging outlet 4 is connected via the reaction product dicharging path 3 to the discharging device E to discharge reaction products generated by reaction occurring in the plasma P.

As shown in FIGS. 18A and 18B, the reaction product discharging outlet 4 and the waveguide open end 24 have the shape of a wide slit. The slit 20, the reaction product discharging outlet 4 and the waveguide open end 24 are arranged parallel to each other.

Next, a method for floating the high-pressure floating electrode H3 will be described.

As shown in FIG. 17, the high-pressure floating electrode H3 is set in the trough portion of the trough-shaped sample stage T12 which fixes the sample J while keeping the electrode H3 non-contact with the trough portion. The high-pressure reaction gas is supplied from the hi-pressure reaction gas supply device R via the high-pressure reaction gas supply path 1 to the high-pressure reaction gas supply slit 20. The high-pressure reaction gas is blown off from the high-pressure reaction gas supply slit 20. The high-pressure floating electrode H3 is then floated by the micro gap D with respect to the sample J due to a difference in pressure between the high-pressure reaction gas and the atmosphere in the reaction container C. The trough-shaped sample stage T12 and the portion 28 opposed to the sample J of the high-pressure floating electrode H3 are held in non-contact with each other. A side 62 of the high-pressure floating electrode H3 is opposed to an inner side 63 of the trough portion of the trough-shaped sample stage T12. The sides 62 and 63 are highly accurately flattened. Further, the width Q12 of the trough portion of the trough-shaped sample stage T12 is slightly greater than the width Q11 of the high-pressure floating electrode H3. A high-pressure gas is supplied from a high-pressure gas supply device (not shown) and blown off from the high-pressure gas supply inlet 25 via the high-pressure gas supply path 26. The inner side 63 of the trough portion of the trough-shaped sample stage T12 and the side 62 opposed to the side 63 of the high-pressure floating electrode H3 are held in non-contact with each other. Further, a moving direction of the high-pressure floating electrode H3 is restricted to a single direction. In the electrode floating type high-pressure floating electrode H3, only the power transmission line includes the intra-electrode waveguide 22. In the method for floating the electrode H3, similar to Example 1, the high-pressure floating electrode H3 is floated by the micro gap D due to a difference in pressure between the high pressure P0 of the high-pressure reaction gas supplied from the high-pressure reaction gas supply slit 20 and the pressure P1 of the low or vacuum atmosphere in the reaction container C evacuated by the discharging device E. The high-pressure reaction gas supply inlet has the shape of awide slit. The slit 20 and the reaction product discharging outlet 4 are arranged parallel to each other. For this reason, the flow of the high-pressure reaction gas from the supply slit 20 to the reaction gas discharging outlet 4 has a uniform flow rate distribution in the direction parallel to the slit 20. Such a uniform flow rate distribution leads to uniformization of the above-described film formation rate distribution at the local high-pressure plasma P generated at the waveguide open end 24.

Next, a method for film formation by the electrode H3 of Example 3 will be described.

Microwave power generated by the microwave power supply G11 is transmitted via the oscillation/matching device M, the flexible waveguide 21, and the intra-electrode waveguide 22 and reaches the waveguide open end 24 provided in the porton 28 opposed to the sample J of the high-pressure floating electrode H3. The microwave power which has reached the waveguide open end 24 is emitted into the high-pressure reaction gas in the micro gap D between the electrode H3 and the sample J. This leads to disassociation of the high-pressure reaction gas, resulting in the local high-pressure plasma P based on the reaction gas. Active seeds based on the reaction gas generated in the plasma P performs film formation on the sample J mmediately under the local high-pressure plasma P.

The cross-sectional shape of waveguide 22 is determined depending on the frequency of the microwave. power supply G11, the sample J, a target film formation characteristic, and a film formation region.

The reaction gas supplied from the high-pressure reaction gas supply slit 20 flows along a surface of the sample J in the micro gap D between the electrode H3 and the sample J toward the low or vacuum atmosphere in the reaction container C and the reaction gas discharging outlet 4 (flow 27). The gap D is provided by the electrode H3 being floated. The power transmission line open end 24 of the waveguide 22 is provided in the portion 28 away from the high-pressure reaction gas supply slit 20 and the reaction gas discharging outlet 4. For this reason, the local high-pressure plasma P is generated in the flow along the sample surface of the high-pressure reaction gas. The flow of the reaction gas without stagnation allows uniform film formation on the sample surface.

Next, effects of using the waveguide 22 for the power transmission line will be described.

In the examples where the power transmission line includes the inner and outer electrodes 5 and 6 in the electrodes H1 and H2, the power supply G is not limited to the microwave power supply G11 but any power supply G supplying power having an arbitrary frequency ranging from direct current to microwave can be used. The insulator 11 isolates the inner electrode 5 from the outer electrode 6, and isolates the inner and outer electrodes 5 and 6 from the reaction gas region in the micro gap D between the electrode H1 or H2 and the sample J. This insulator 11 needs to be attached to the outer surface of the inner electrode 5 and the inner surface of the outer electrode 6 without a crevice. In this case, heat generated by the local high-pressure pressure P causes deformation of the inner and outer electrodes 5 and 6. In particular, thermal expansion of the inner electrode 5 is likely to cause damage to the insulator 11. To avoid this, the outer and inner electrodes 6 and 5 need to be cooled. It is actually very difficult to provide an arrangement for uniformly cooling the electrode H1 or H2 which has a complicated structure.

In Example 3, the waveguide 22 is included in the power transmission line. A distinction does not need to be made between the inner electrode 5 to which voltage is applied and the outer electrode 6 which confines an electric field. The microwave is propagated in the is waveguide 22. In such a case, it is easy to fabricate the power transmission line and an intra-electrode cooling path in the high-pressure floating electrode H3. Moreover, the metal structure surrounds the insulator 23. In general, metal has a larger thermal coefficient of expansion than that of insulator. The thermal expansion of the metal structure is unlikely to damage the insulator 23.

Effects obtained by using the microwave power supply G11 as a power supply will be described. The following Table 5 indicates the values of oscillation amplitude L ($\cong$e·E0/4m$\pi^2$f$^2$) where a variety of charged particles (electric charge amount e, mass m) oscillate in vacuum in the presence of an oscillating electric field E ($\cong$E0·sin(2$\pi$ft) where t is time) periodically changing at a frequency of f with the maximum intensity E0 of an electric field. Here E0 is equal to 1.0×10$^6$ v/m.

|  | He$^+$ | Ar$^+$ | Si$^{4+}$ |
|---|---|---|---|
| 50 kHz | 242.8 [m] | 24.28 [m] | 138.2 [m] |
| 1 MHz | 0.607 [m] | 0.0607 [m] | 0.345 [m] |
| 13.56 MHz | 3302 [μm] | 330 [μm] | 1880 [μm] |
| 100 MHz | 60.7 [μm] | 6.07 [μm] | 34.6 [μm] |
| 1 GHz | 0.607 [μm] | 0.0607 [μm] | 0.346 [μm] |
| 2.45 GHz | 0.101 [μm] | 0.0101 [μm] | 0.0576 [μm] |

Figure 19A:
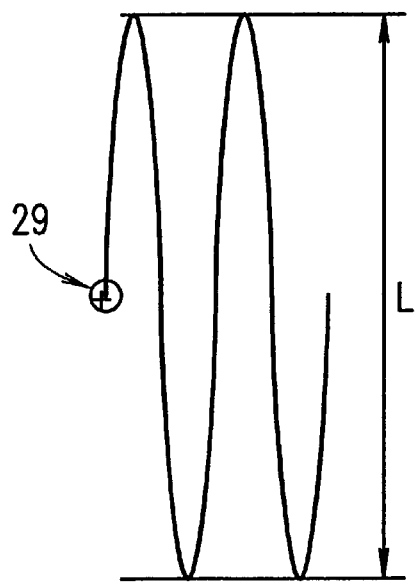
FIG. 19A is a conceptual diagram illustrating the amplitude of a charged particle oscillated by an oscillating electric field.
Figure 19B:
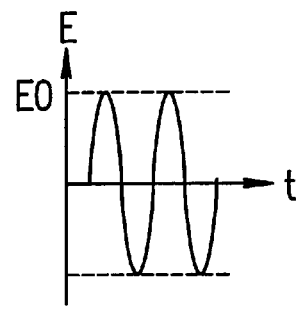
FIG. 19B is a diagram illustrating the oscillating electric field causing the oscillation shown in FIG. 19A.

FIG. 19A is a conceptual diagram illustrating the oscillation amplitude L of a charged particle 29 due to the oscillating electric field E (see FIG. 19B).

As is seen from Table 5, the oscillation amplitude L due to the oscillating electric field E is decreased with an increase in frequency. The micro gap D is a narrow gap in a range. of about 1 μm to about several hundreds μm. When a radio-frequency power supply having a frequency of about 1 MHz is used as the power supply for generating the local high-pressure plasama P, the oscillation amplitude L is about 0.607 m in the case of He ion. This value is sufficiently large that the charged particle cannot be trapped in the narrow gap D. As a result, the charged particle collides with and damages the sample surface or a film surface during the film formation, resulting in film quality having a large defect density.

When the micro gap D between the electrode H3 and the sample J is several hundreds μm, the power supply for generating the local high-pressure plasma P requires a radio frequency of at least about 10 MHz or greater. When the micro gap D is several tens μm, the power supply requires a microwave having a frequency of about 1 GHz or greater. In these cases, the charged particle is trapped within the micro gap D between the electrode H3 and the sample J, whereby film formation can be performed without damaging a film.

As shown in FIG. 17, to obtain relative movement between the sample J and the high-pressure floating electrode H3, the sample J is fixed in the inner bottom of the trough-shaped sample stage T12 using a sample fixing portion F. The inner side 63 of the trough portion of the trough-shaped sample stage T12 and the side 62 opposed to the side 63 of the high-pressure floating electrode H3 are held in non-contact with each other, using the high-pressure gas blown off from the high-pressure gas supply inlet 25 provided in the inner side 63, This is done in an air-slide way without a sliding arrangement. The scanning direction of the high-pressure floating electrode H3 is restricted to a single direction horizontal to the sample J. A scanning in a direction horizontal to the sample J is performed by driving the high-pressure floating electrode H3 by a driving motor 10 (not shown in FIG. 17). To this end, the high-pressure floating electrode H3 is connected to the driving motor 10 via a scanning wire or belt 9, and the driving motor 10 is rotated.

The high-pressure gas blown off from the high-pressure gas supply inlet 25 is not limited to the high-pressure reaction gas used in film formation on the sample J. A highly insulative gas, a rare gas, or air may be adopted depending on purposes.

EXAMPLE 4

Next, Example 4 of this invention will be described.

Figure 20A:
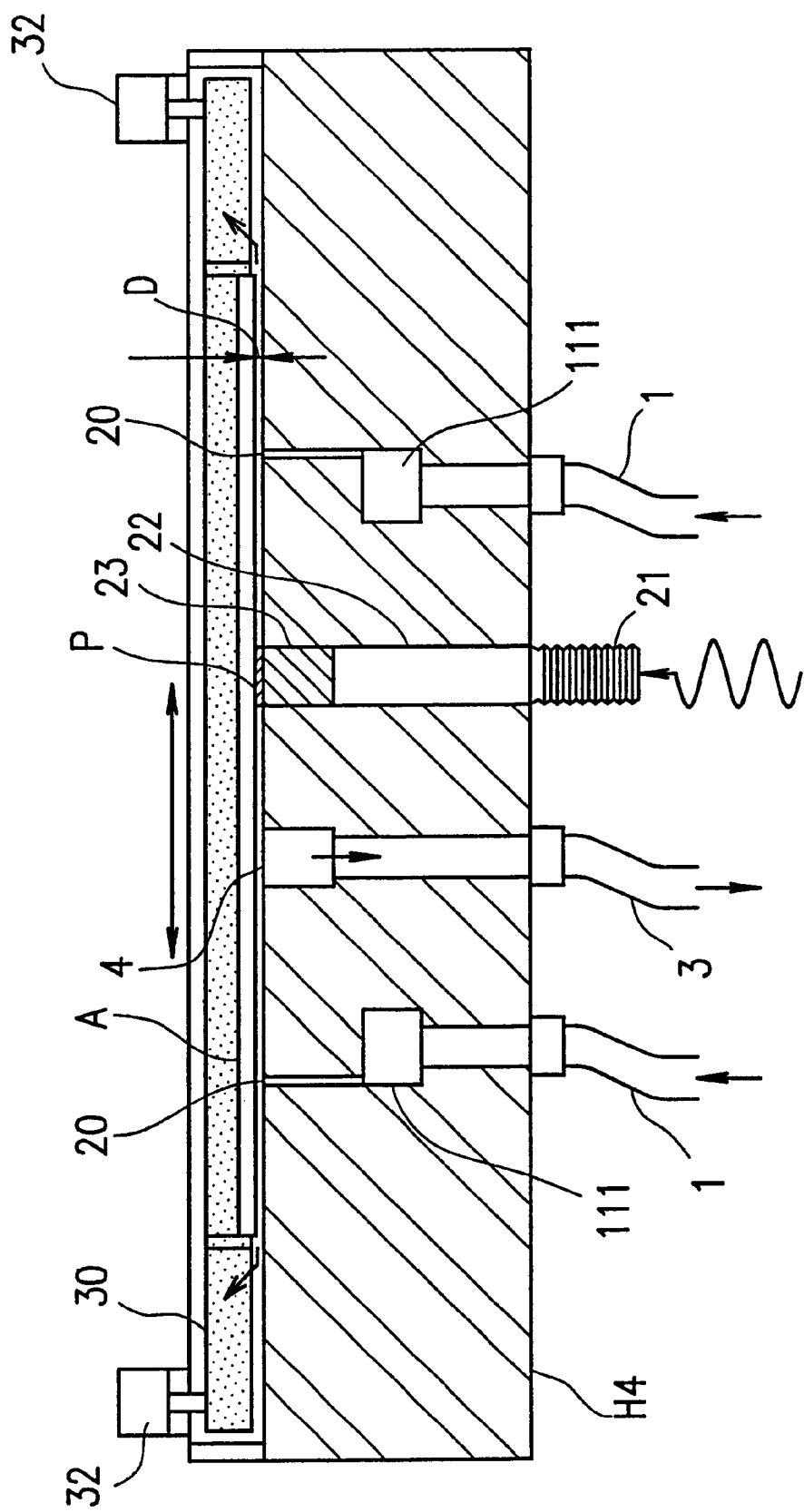
FIG. 20A is a cross-sectional view illustrating a sample floating type high-pressure floating electrode H4 in which a power transmission line includes a waveguide.
Figure 20B:
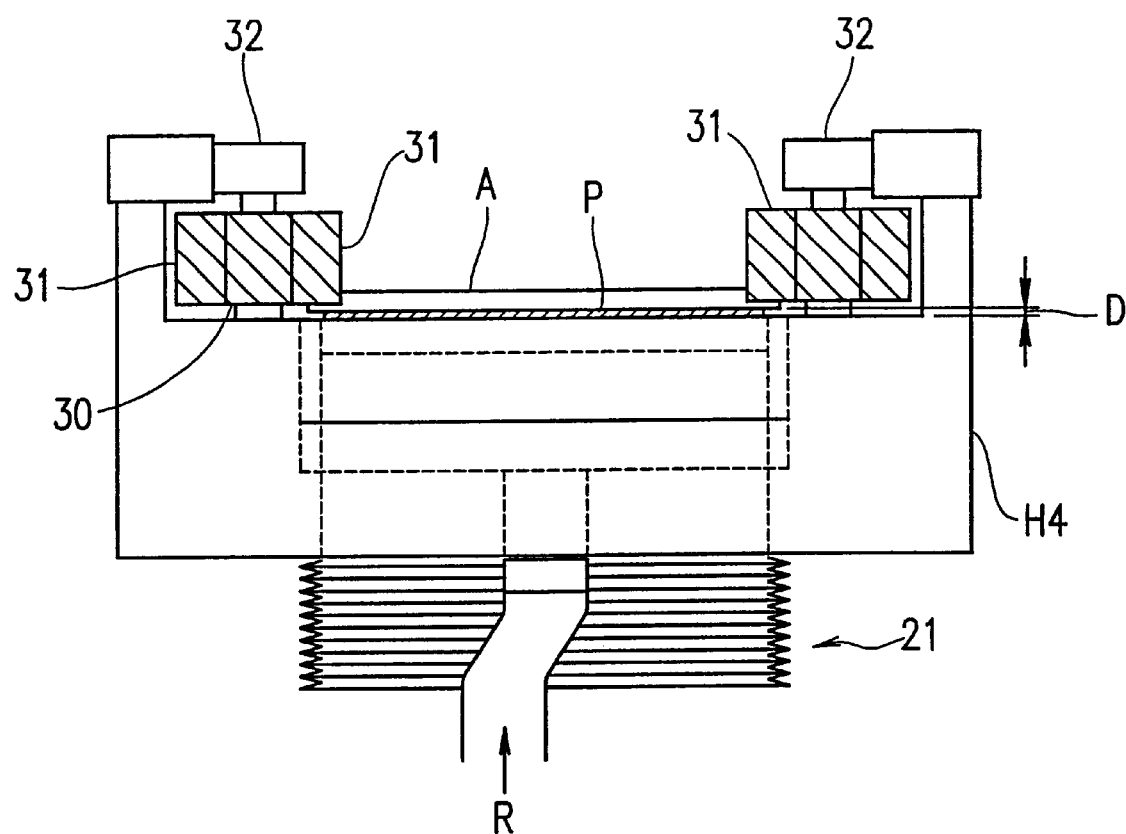
FIG. 20B is a front view illustrating the sample floating type high-pressure floating electrode H4 in which a power transmission line includes a waveguide.

FIGS. 20A, 20B, and 20C are cross-sectional, front, and plan views, respectively, illustrating a sample floating type high-pressure floating electrode in which a waveguide is included in a power transmission line. In these figures, reference numeral H4 indicates a sample floating type high-pressure floating electrode in which a waveguide is included in a power transmission line: 30 a floating sample transporting belt having a protrusion; 31 the protrusion of the transporting belt 30; and 32 a floating sample transporting motor.

In the sample floating type high-pressure floating electrode R4 in which a waveguide is included in a power transmission line, similar to the electrode floating type high-pressure floating electrode H3 in Example 3, a microwave is transmitted via the waveguide. The local high-pressure plasma P is generated at the waveguide open end 24 provided in a portion opposed to a sample A of the electrode H4. A high-pressure reaction gas supplied into the micro gap D is decomposed to generate active seeds based on the reaction gas which form a film on a surface of the floating sample A. There is a flow of the reaaction gas along the sample surface in the micro gap D between the electrode H4 and the sample A, in which a uniform film is formed on the surface of the sample A. Similar to Example 2, a time required to chuck the sample A can be omitted. Therefore, film formation and sample transfer can be performed in an assembly-line way. This leads to an increase in process productivity.

In Example 4, a configuration of the overall apparatus partially shown in FIGS. 20A, 20B, and 20C, the principle of floating the sample, a method for generating the plasma, a principle and method for simultaneously achieving a film formation phenomenon in the local plasma, a high film formation rate, an improvement in film quality, and a clean surface of a film after film formation are similar to those in Example 1.

The sample A may be fixed to the sample stage (not shown). The sample A as well as the sample stage may be floated as shown in FIG. 14.

Scanning movement of the floating sample A may be performed as shown in FIG. 20C. Both ends of the floating sample transporting belt 30 having the protrusion 31 are restrained or rotated by the floating sample transporting motors 32. The sample A is fixed by the protrusion 31, 60 that the sample A is transported in a single direction or reciprocated by rotating the motor 32.

EXAMPLE 5

Next, Example 5 of this invention will be described.

Figure 21:
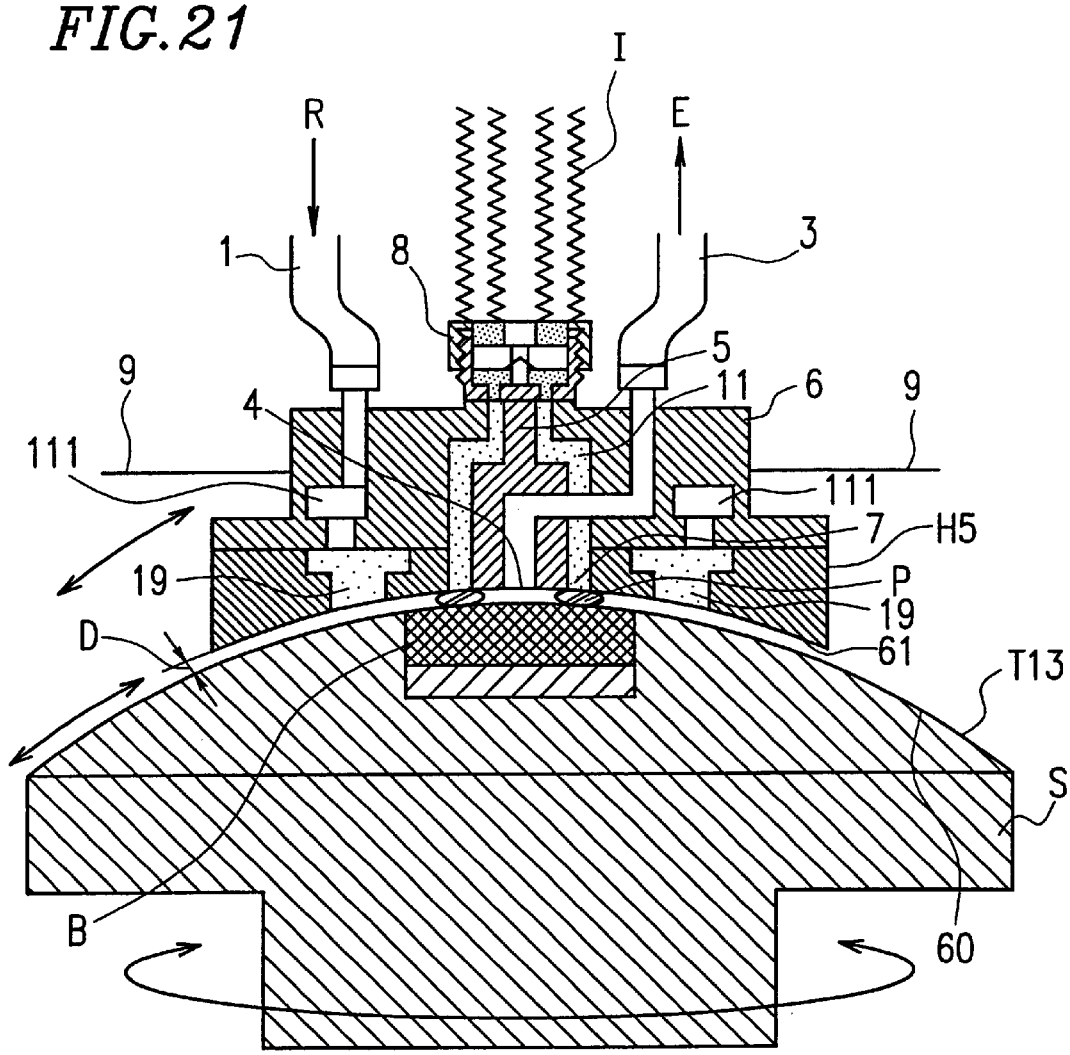
FIG. 21 is a partial cross-sectional view illustrating a high-pressure floating electrode H5 performing surface flattening and film formation for a sample having a spherical surface.

FIG. 21 is a partial cross-sectional view illustrating a high-pressure floating electrode for forming a film on a sample having a spherical surface. In FIG. 21, reference numeral H5 indicates a high-pressure floating electrode having a portion having a spherical surface which is opposed to a sample; T13 a spherical-surface sample fixing sample stage; B a sample having a spherical surface on which a film is to be formed; 60 a surface opposed to the electrode H5 of the spherical-surface sample fixing sample stage T13; and 61 a portion opposed to the sample B of the high-pressure floating electrode H5.

When forming a film on the sample B having a spherical surface on which the film is to be formed, the surface 60 opposed to the electrode H5 of the spherical-surface sample fixing sample stage T13 also is spherical. The curvature radius of the surface 60 is in agreement with the curvature radius of the spherical surface of the sample B. The sample B is placed in the sample stage T13. in such a manner that there is substantially no step between the spherical surface of the sample 13 and the surface 60. Similarly, the portion 61 opposed to the sample B of the high-pressure floating electrode H5 is spherical. The curvature radius of the portion 61 is greater than or equal to the curvature radius of the sample B. The portion 61 of the high-pressure floating electrode H5 is opposed to the spherical surface of the sample B. The high-pressure floating electrode H5 is floated with respect to the sample B by a micro gap D due to a difference in pressure between a high-pressure reaction gas supplied from a high-pressure reaction gas supply inlet using a porous material 19 and a low or vacuum pressure in a reaction container.

The sample B may be floated with respect to the high-pressure floating electrode H5 by a micro gap D due to the difference in pressure between the high-pressure reaction gas supplied from the high-pressure reaction gas supply inlet and the low or vacuum pressure in the reaction container (not shown) similar to the sample floating type high-pressure floating electrode H4.

Plasma generation is performed in a way similar to that in Example 1. Direct or alternating current generated by a power supply G (not shown) is transmitted to a power transmission line open end 7 provided at the portion 61 opposed to the sample B of the electrode H5. A strong electric field is thus generated in the micro gap D between the electrode H5 and the sample B in which a high-pressure reaction gas is supplied. Active seeds based on the reaction gas form a film on the sample B.

In the structure shown in FIG. 21, the power transmission line includes inner and outer electrodes 5 and 6. The direct or alternating current generated by the power supply G (not shown in FIG. 21) is transmitted to the power transmission line open end 7 and further the local high-pressure plasma P. Alternatively, when the power supply is a microwave power supply, a microwave is transmitted, for example, by a waveguide as shown in FIG. 16 in connection with Example 4. The portion 28 opposed to the sample J in FIG. 18A may be spherical as is the portion 61 opposed to the sample B of the high-pressure floating electrode H5. A strong electric field is generated at a waveguide open end provided a portion opposed to a sample so that the local high-pressure plasma P is generated to form a film on the spherical surface of the sample B.

The following features described in the foregoing examples can also be applied to Example 5 in which the film formation surface of the sample is spherical the shape and position of the high-pressure reaction gas supply inlet, reaction product discharging outlet, and microwave open end; the shape of the high-pressure floating electrode; the formation of the corrosion-resistant and high-hardness insulator with respect to the portion opposed to the sample; the placement of the corrosion-resistant and high-hardness insulator material with respect to the portion opposed to the sample; the sample stage; the sample fixing portion; and the like, which are used in the electrode floating type high-pressure floating electrode H1, the sample floating type high-pressure floating electrodes H2 and H3, or the high-pressure floating electrode H4 in which a waveguide is included in a microwave transmission line In the foregoing description of the examples of this invention, film formation ismainly described. This invention can be applied to surface modification.

As described above, according to this invention, a sample and an electrode to which power is applied are provided opposed to each other in the desired atmosphere. Plasma is then locally generated in the presence of applied power. Only the plasma generated region is held at a high pressure-.and surface treatment (e.g., film formation or surface modification) is efficiently performed for a surface of a sample. Meanwhile, the desired atmosphere is held at a lower pressure than that in the local high-pressure plasma generated portion or under vacuum. For this reason, reaction products are not condensed and are not attached to the sample surface again, thereby obtaining high-quality film forination or surface modification. Further, the plasma generated region is restricted to a region where a reaction gas flow is generated along the sample surface other than a region in a gap between the electrode and the sample and in the vicinity of a reaction gas supply inlet from which the reaction gas is blown off. In film formation, therefore, a film thickness distribution substantially is not formed immediately under the reaction gas blowoff region. In surface modification, a thickness distribution of a modified layer substantially is not formed immediately under the reaction gas blowoff region.

According to this invention, plasma is locally generated in a high-pressure reaction gas region. A film can be formed on a sample at a high rate. A region other than the high-pressurereaction gas region where the local plasma is generated has a pressure lower than that of the high-pressure reaction gas region. For this reason, reaction products is less condensed in an atmosphere surrounding the sample, thereby obtaining high-quality film formation and a clean film surface.

According to this invention, $px/p0>$ is satisfied where the $px/p0$ is a ratio of a pressure $px$ of a region in which high-pressure plasma is generated in a high-pressure atmosphere locally held in a low-conductance flow region to a pressure $P0$ of an atmosphere in which a sample is placed. High-density active seeds are generated in the plasma, so that a high film formation rate is achieved. The atmosphere has a pressure lower than that in the plasma generated region. For this reason, reaction products is less condensed in an atmosphere surrounding the sample, thereby obtaining high-quality film formation and a clean film surface.

According to this invention, the pressure of a region other than the local high-pressure plasma region may be one atmospheric pressure or less so that the reaction gas has difficulty in diffusinginto room air, thereby improving the safety of the apparatus.

According to this invention, a region other than the local high-pressure plasma region may be under vacuum, thereby reducing the grain diameter of a reaction product and the number of reaction products in the atmosphere surrounding the sample. High-quality film formation and a clean film surface can thus be obtained. Since the atmosphere is held at vacuum, the reaction gas does not need to be discharged through the reaction product discharging outlet and the reaction product discharging path every time the sample is transferred to room air. The throughput of the apparatus can be improved.

According to this invention, the local high-pressure plasma is generated in a specific region in the high-pressure reaction gas region of the low-conductance flow path, thereby performing film formation locally at the desired position.

A region where the local high-pressure plasma is generated to form a film on the sample is positioned away from a portion for supplying the reaction gas, thereby preventing formation of film thickness distribution immediately under the reaction gas supply portion. Thus, a uniform film can be obtained.

The electrode and the sample stage have a shape corresponding to a sample. At least one of the electrode and the sample includes a high-pressure reaction gas supply inlet. The electrode is provided a micro gap from the sample so that the electrode functions as a wall surface for forming a low-conductance region of a gas flow from the inlet to the atmosphere. Thus, the above-described high-pressure reaction gas region can be locally formed. Power is applied to the electrode. Plasma is generated in the micro gap between the electrode and the sample where the pressure of the reaction gas is increased due to the low conductance. High-speed and high-quality film formation and a clean film surface can be obtained with respect to a sample.

Due to a difference in pressure between the high-pressure reaction gas supplied from the reaction gas supply inlet and the atmosphere, one of the electrode and the sample stage is floated with respect to the other. A low-conductance gas flow path can be stably provided in a large area of the micro gap, even in the case such that the measurement and control of the micro gap is difficult due to deformation of the electrode or sample due to plasma heat, an electric field for generating plasma, or a corrosive gas. Further, the electrode is prevented from being tilted with respect to the sample, resulting in a uniform flow amount distribution of the reaction gas. The uniformity of film thickness can be improved.

A magnetic material or an arrangement for generating a magnetic force is provided on one of the electrode and the sample stage. Due to the magnetic force generated by the magnetic material or the arrangement, one of the electrode and the sample stage is floated with respect to the other, having a micro gap in between. A low-conductance gas flow path can be stably provided In a large area of the micro gap. An additional magnetic material or arrangement for generating a magnetic force maybe provided so as to float the electrode or the sample. The range of the reaction gas pressure may then be wider, so that the pressure of the supplied reaction gas is determined by a target film formation characteristic, not by the weight of the electrode.

A power transmission line is provided in the electrode. Apowertransmissionlineopen,end is provided in a portion opposed to a sample. Power applied to the electrode is transmitted to the power transmission line open end, thereby generating plasma locally only in the vicinity of the open end. Since the waveguide for transmitting power is open-ended by the plasma, the equivalence circuit of a power applying arrangement is not varied even when the electrode and the sample are relatively moved so as to form a film on the entire sample. As a result, the influence on the plasma is reduced, thereby obtaining a uniform film formation at a larger area.

The power for generating plasma may be microwave power. The use of microwave power leads to secure capture of a charged particle generated in plasma between the electrode and the sample, thereby reducing damage to a film formed on the sample surface. In addition, plasma can be generated between the electrode and the sample which hold a micro gap in between.

The power transmission line includes a waveguide within the electrode, thereby simplifying the structure of the electrode. This leads to prevention of the damage of the electrode due to deformation of the electrode caused plasma heat The reliability of the apparatus can thus be improved and the simplification of the shape of the component leads to a reduction in cost of the apparatus.

A reaction product discharging outlet, which has an opening directed to the micro gap in which plasma is generated, is provided in the electrode or the sample stage. A reaction product generated in the plasma is quickly discharged from the outlet. A high-quality film can thus be formed on the sample. Further, a surface of a film can be held clean.

A portion opposed to the sample of the electrode has a shape similar to a surface of the sample. Local plasma is generated in a flow along the sample surface from a high-pressure region in the vicinity of the reaction gas supply portion to the atmosphere around the electrode or to the reaction gas discharging outlet. Active seeds based on the reaction gas which are generated in the plasma flow along the sample surface without stagnation, resulting in formation of a uniform film on the sample.

A power absorber having a large absorption coefficient with respect to an electromagnetic wave having a frequency of a power supply used is provided in at least one of the electrode and the sample stage. The power absorber is provided at a region having a pressure lower than the high-pressure plasma generated region in the gas flow path having a low conductance. The power absorber absorbs an electromagnetic wave, which is not consumed but passes through the high-pressure plasma generated region, to prevent plasma generation in low-pressure atmosphere outside a region having local high-pressure atmosphere.

The electrode for generating plasma and the sample are relatively moved for scanning, thereby forming a film on a large area of the sample. Controlling the scanning speed leads to formation of a film having the desired film thickness distribution.

The atmosphere discharged from the reaction container is reprocessed and then supplied into the reaction container again as the reaction gas or the atmosphere without waste of the reaction gas or the atmosphere, thereby reducing film formation cost.

Power in a wide range from direct to low-frequency to high-frequency to microwave may be applied to the electrode.

The effects of this invention are described when this invention is applied to film formation. Similar effects can be obtained when this. invention is applied to surface modification.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An apparatus for treating a sample using plasma when the sample is placed on a surface, comprising:
    a predetermined atmosphere having the sample provided therein
    a reaction gas supply portion supplying a reaction gas;
    characterized in that a wail surface is opposed to the sample and provides a gas flow path from the reaction gas supply portion to the predetermined atmosphere between the sample and the wall surface, which has a gas flow conductance providing a high pressure reaction gas reglion in the gas flow path, and which has a pressure relatively higher than a pressure of the predetermined atmosphere;

a high-pressure plasma generating portion for locally generating high-pressure plasma in the high-pressure reaction gas region based on the reaction gas;

characterized in that the high-pressure plasma generating portion floats above the sample and the sample is subjected to surface treatment using an active seed in the high-pressure plasma; and an electrode which Includes the wall surface, and a power supply which supplies power to the eletrode to generate the high-pressure plasma, characterized in that the electrode is opposed to the sample, forming a micro gap between the wall surface of the electrode and the sample.

2. An apparatus according to claim 1 further characterized in that the gas flow conductance is a value which provide px/p0>1, px/p0 being a ratio of a pressure px of a region in which the high-pressure plasma is generated locally at the high-pressure plasma generating portion to a pressure p0 of the predetermined atmosphere.

3. An apparatus according to claim 1 further characterized in that the high-pressure plasma generating portion is at a position away from the reaction gas supply portion but also in the high-pressure reaction gas region.

4. An apparatus according to claim 1 further characterized in that the sample is placed on a sample stage; the sample stage having a shape corresponding to the sample.

5. An apparatus according to claim 1, further charactrized in that the electrode has a shape corresponding to the shape of the sample.

6. An apparatus according to claim 1, wherein the electrode further includes a reaction gas supply inlet for supplying the reaction gas to the gas flow path.

7. An apparatus according to claim 1, further characterized in that at least one of the electrode and the sample stage is movable; that, due to a difference in pressure between a pressure of the predetermined atmosphere and a pressure of the reaction gas supplied from the reaction gas supply portion, one of the electrode and the sample stage is floated with respect to the other; and that a surface opposed to the sample of the electrode functions as the wall surface.

8. An apparatus according to claim 1, further characterized in that an arrangement for generating a magnetic force having a predetermined magnetic intensity is provided on at least one of the electrode and the sample stage;

that at least one of the electrode and the sample stage is movable, and that due to the magnetic force generated by the arrangement, one of the electrode and the sample stage is floated with respect to the other; and there is a micro gap between the electrode and the sample; and a surface opposed to the sample of the electrode functions as the wall surface.

9. An apparatus according to claim 1, further characterized in that an arrangement for generating a magnetic force having a predetermined magnetic intensity is provided on at least one of the electrode and the sample stage;

that at least one of the electrode and the sample stage is movable, and that due to the magnetic force generated by the arrangement and a difference in pressure between a pressure of the atmosphere in the reaction container and a pressure of the reaction gas supplied from the reaction gas supply portion, one of the electrode and the sample stage is floated with respect to the other; and there is a micro gap between the electrode and the sample; and a surface opposed to the sample of the electrode functions as the wall surface.

10. An apparatus according to claim 1, further comprising a power transmission line provided in the electrode and having an open end at the high pressure plasma generating portion opposed to the sample, and which transmits power applied to the electrode to the open end and generates the high-pressure plasma at the open end and by the high electric field.

11. An apparatus according to claim 10, further characterized in that the power transmission line in the electrode includes an inner conductor for applying the power and an electric field shielding conductor which covers the inner conductor via an insulator and is connected to ground.

12. An apparatus according to claim 1, further characterized in that the power applied to the electrode is radio-frequency power having a frequency band of about 10 MHz to about 1 GHz, or microwave power having a frequency band of about 1 GHz or greater.

13. An apparatus according to claim 12, further characterized in that the power transmission line includes a waveguide which is provided in the electrode and has an open and at the high-pressure generating portion opposed to the surface of the electrode.

14. An apparatus according to claim 1 further comprising a power absorber provided in at least one of the electrode and the sample stage and opposed to a region having a pressure lower than the high-pressure plasma generating portion in the gas flow path, the power absorber having a absorption coefficent with respect to or electromagnetic wave having a frequency of the power supplied from the power supply which absorbs an electromagnetic wave passing through the high-pressure plasma and prevents plasma from generating in the region having pressure lower than the high-pressure plasma generating portion.

15. An apparatus according to claim 1 further comprising a discharging outlet provided in at least one of the sample stage and the eletrode and having an opening directed to the gas flow path between the electrode and the sample and discharging a reaction product generated in the high pressure plasma.

16. An apparatus according to claim 15 further comprising a reaction container for maintaining the predetermined atmosphere; and a section for reprocessing a gas discharged from the reaction container or the discharging outlet and supplying the gas into the reaction container or the reaction gas supply portion again as the reaction gas or the predetermined atmosphere.

17. An apparatus according to claim 1 further comprising a reaction container for maintaining the predetermined atmosphere.

18. An apparatus according to claim 1 further comprising a section for providing a relative movement between the sample, and an apparatus for treating a surface so that the entire sample is subjected to the surface treatment.

19. An apparatus according to claim 18, further characterized in that the section for providing a relative movement moves relative to the surface of the sample.

20. An apparatus according to claim 18, further characterized in that the section for providing a relative movement moves the surface of the sample relative to the apparatus for treating a surface.

21. An apparatus according to claim 1, further characterized in that the micro gap between the electrode and the sample is in the range of 1 to 100 microns.

* * * * *

UNITED STATES PATENT AND TRADEMARK OFFICE
CERTIFICATE OF CORRECTION

PATENT NO.     : 6,406,590 B1
DATED          : June 18, 2002
INVENTOR(S)    : Yusuke Ebata et al.

It is certified that error appears in the above-identified patent and that said Letters Patent is hereby corrected as shown below:

<u>Title page,</u>
Please delete Item "[63] Related U.S. Application Data" entirely.

<u>Column 1,</u>
Lines 4 and 5, please delete the following: "This application is a continuation of 09/149,334 filing date Sep. 8, 1998 now U.S. Pat. No. 6,058,751."

Signed and Sealed this

First Day of July, 2003

JAMES E. ROGAN
*Director of the United States Patent and Trademark Office*